(12) United States Patent
Choi

(10) Patent No.: US 12,349,557 B2
(45) Date of Patent: Jul. 1, 2025

(54) DISPLAY APPARATUS HAVING GROOVES AND BRIDGES AT THE BOUNDARIES BETWEEN ADJACENT PIXELS

(71) Applicant: SAMSUNG DISPLAY CO., LTD., Yongin-si (KR)

(72) Inventor: Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 635 days.

(21) Appl. No.: 17/700,940

(22) Filed: Mar. 22, 2022

(65) Prior Publication Data

US 2022/0376011 A1    Nov. 24, 2022

(30) Foreign Application Priority Data

May 24, 2021    (KR) .................. 10-2021-0066339

(51) Int. Cl.
    *H10K 59/124*    (2023.01)
(52) U.S. Cl.
    CPC ................... *H10K 59/124* (2023.02)
(58) Field of Classification Search
    CPC .. H10K 59/121; H10K 59/124; H10K 59/131; H10K 59/1216; H10D 86/441; H10D 86/451; H10H 29/32
    See application file for complete search history.

(56) References Cited

U.S. PATENT DOCUMENTS

| | | |
|---|---|---|
| 10,446,062 B2 | 10/2019 | Li et al. |
| 10,868,096 B2 | 12/2020 | Park et al. |
| 11,449,163 B2 * | 9/2022 | Park .................. G06F 3/0448 |
| 2016/0077366 A1 * | 3/2016 | Kim .................. G02F 1/1368 349/43 |
| 2018/0097044 A1 * | 4/2018 | Choi .................. H10K 59/131 |
| 2018/0322826 A1 | 11/2018 | Lee et al. |
| 2019/0278145 A1 | 9/2019 | Tanaka et al. |
| 2020/0312937 A1 | 10/2020 | Nguyen et al. |
| 2020/0328269 A1 | 10/2020 | Shin et al. |

(Continued)

FOREIGN PATENT DOCUMENTS

| | | |
|---|---|---|
| KR | 1020190104091 A | 9/2019 |
| KR | 1020200115753 A | 10/2020 |

(Continued)

*Primary Examiner* — Marcos D. Pizarro
*Assistant Examiner* — Tiberiu Dan Onuta
(74) *Attorney, Agent, or Firm* — CANTOR COLBURN LLP

(57) ABSTRACT

A display apparatus includes a substrate including a first pixel area and a second pixel area adjacent to each other, a first insulating layer disposed on the substrate, where a first groove or a first opening corresponding to a boundary between the first pixel area and the second pixel area and a second groove or a second opening corresponding to the boundary between the first pixel area and the second pixel area are defined in the first insulating layer, and the second groove or the second opening is spaced apart from the first groove or the first opening, and a first conductive layer disposed over the first insulating layer, where the first conductive layer includes a first conductive pattern disposed in the first pixel area, a second conductive pattern disposed in the second pixel area, and a bridge connecting the first conductive pattern to the second conductive pattern.

20 Claims, 28 Drawing Sheets

(56) References Cited

U.S. PATENT DOCUMENTS

2023/0269972 A1* 8/2023 Choi ................ H10K 71/00 257/91
2024/0090240 A1* 3/2024 Futatsuyama .......... H01L 24/80

FOREIGN PATENT DOCUMENTS

| KR | 1020200119452 A | 10/2020 |
| KR | 1020210008977 A | 1/2021 |

* cited by examiner

DISPLAY APPARATUS HAVING GROOVES AND BRIDGES AT THE BOUNDARIES BETWEEN ADJACENT PIXELS

This application claims priority to Korean Patent Application No. 10-2021-0066339, filed on May 24, 2021, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus capable of displaying a high-resolution image while having a low defect rate due to an external impact.

2. Description of the Related Art

Generally, in a display apparatus such as an organic light emitting display apparatus, thin film transistors are arranged in each (sub)pixel to control the luminance or the like of each (sub)pixel. The thin film transistors control the luminance or the like of the corresponding (sub)pixel according to a received data signal or the like.

SUMMARY

Conventionally, such a display apparatus typically has a problem or is defective due to an external impact and it is not easy to display a high-resolution image.

In one or more embodiments provide a display apparatus capable of displaying a high-resolution image while having a low defect rate due to an external impact.

According to an embodiment, a display apparatus includes a substrate including a first pixel area and a second pixel area adjacent to each other, a first insulating layer disposed over the substrate, where a first groove or a first opening corresponding to a boundary between the first pixel area and the second pixel area and a second groove or a second opening corresponding to the boundary between the first pixel area and the second pixel area are defined in the first insulating layer, and the second groove or the second opening is apart from the first groove or the first opening, and a first conductive layer disposed over the first insulating layer, where the first conductive layer includes a first conductive pattern disposed in the first pixel area, a second conductive pattern disposed in the second pixel area, and a bridge connecting the first conductive pattern to the second conductive pattern.

In an embodiment, the first conductive pattern, the second conductive pattern, and the bridge may be integrally formed with each other as a single unitary unit.

In an embodiment, the bridge may pass between the first groove or the first opening and the second groove or the second opening.

In an embodiment, in a view in a direction perpendicular to the substrate, an end of the first groove or the first opening in a direction therefrom to the second groove or the second opening may overlap one edge of the bridge in a direction therefrom to the first groove or the first opening, and an end of the second groove or the second opening in a direction therefrom to the first groove or the first opening may overlap another edge of the bridge in a direction therefrom to the second groove or the second opening.

In an embodiment, the display apparatus may further include a second insulating layer covering the first conductive layer, where a first additional opening exposing the first groove or the first opening, a second additional opening exposing the second groove or the second opening, and a connection opening connecting the first additional opening to the second additional opening may be defined in the second insulating layer, and the first additional opening, the connection opening, and the second additional opening may be connected with each other.

In an embodiment, the first conductive layer may further include a first line disposed in the first pixel area and a second line disposed in the second pixel area, and the display apparatus may further include a third insulating layer disposed over the second insulating layer and filling the first groove or the first opening, the second groove or the second opening, the first additional opening, the second additional opening, and the connection opening, and a second conductive layer disposed over the third insulating layer, where the second conductive layer may include a connection conductive pattern electrically connecting the first line to the second line by contacting the first line and the second line through contact holes defined in the second insulating layer and the third insulating layer.

In an embodiment, the bridge may include a first prong connecting the first conductive pattern to the second conductive pattern and a second prong connecting the first conductive pattern to the second conductive pattern.

In an embodiment, a plurality of through holes may be defined in the bridge.

According to an embodiment, a display apparatus includes a substrate including a first pixel area and a second pixel area adjacent to each other, a first insulating layer disposed over the substrate, where a first groove or a first opening corresponding to a boundary between the first pixel area and the second pixel area and a second groove or a second opening corresponding to the boundary between the first pixel area and the second pixel area are defined in the first insulating layer, and the second groove or a second opening is apart from the first groove or the first opening, and a first semiconductor layer disposed over the first insulating layer and including a first semiconductor layer disposed in the first pixel area, a second semiconductor layer disposed in the second pixel area, and a bridge connecting the first semiconductor layer to the second semiconductor layer.

In an embodiment, the first semiconductor layer, the second semiconductor layer, and the bridge may be integrally formed with each other as a single unitary unit.

In an embodiment, the bridge may pass between the first groove or the first opening and the second groove or the second opening.

In an embodiment, in the view in the direction perpendicular to the substrate, an end of the first groove or the first opening in a direction therefrom to the second groove or the second opening may overlap one edge of the bridge in a direction therefrom to the first groove or the first opening, and an end of the second groove or the second opening in a direction therefrom to the first groove or the first opening may overlap another edge of the bridge in a direction therefrom to the second groove or the second opening.

In an embodiment, the display apparatus may further include a second insulating layer covering the first semiconductor layer, and a first conductive layer disposed over the second insulating layer, where the first conductive layer may include a shield layer overlapping the bridge in the view in the direction perpendicular to the substrate.

In an embodiment, a first additional opening exposing the first groove or the first opening and a second additional opening exposing the second groove or the second opening may be defined in the second insulating layer.

In an embodiment, in the view in the direction perpendicular to the substrate, an end of the first groove or the first opening in a direction therefrom to the second groove or the second opening may overlap one edge of the shield layer in a direction therefrom to the first groove or the first opening, and an end of the second groove or the second opening in a direction therefrom to the first groove or the first opening may overlap another edge of the shield layer in a direction therefrom to the second groove or the second opening.

In an embodiment, the display apparatus may further include a third insulating layer covering the first conductive layer, where a third additional opening exposing the first additional opening, a fourth additional opening exposing the second additional opening, and a connection opening connecting the third additional opening to the fourth additional opening may be defined in the third insulating layer, and the third additional opening, the connection opening, and the fourth additional opening may be connected with each other.

In an embodiment, a width of the shield layer in a direction perpendicular to an imaginary straight line connecting a center of the first pixel area to a center of the second pixel area may be greater than a width of the bridge in the direction perpendicular to the imaginary straight line.

In an embodiment, the first conductive layer may further include a driving gate electrode disposed in each of the first pixel area and the second pixel area.

In an embodiment, the bridge may include a first prong connecting the first semiconductor layer to the second semiconductor layer and a second prong connecting the first semiconductor layer to the second semiconductor layer.

In an embodiment, a plurality of through holes may be defined in the bridge.

BRIEF DESCRIPTION OF THE DRAWINGS

The above and other features of certain embodiments will be more apparent from the following description taken in conjunction with the accompanying drawings, in which.

DETAILED DESCRIPTION

Figure 1:
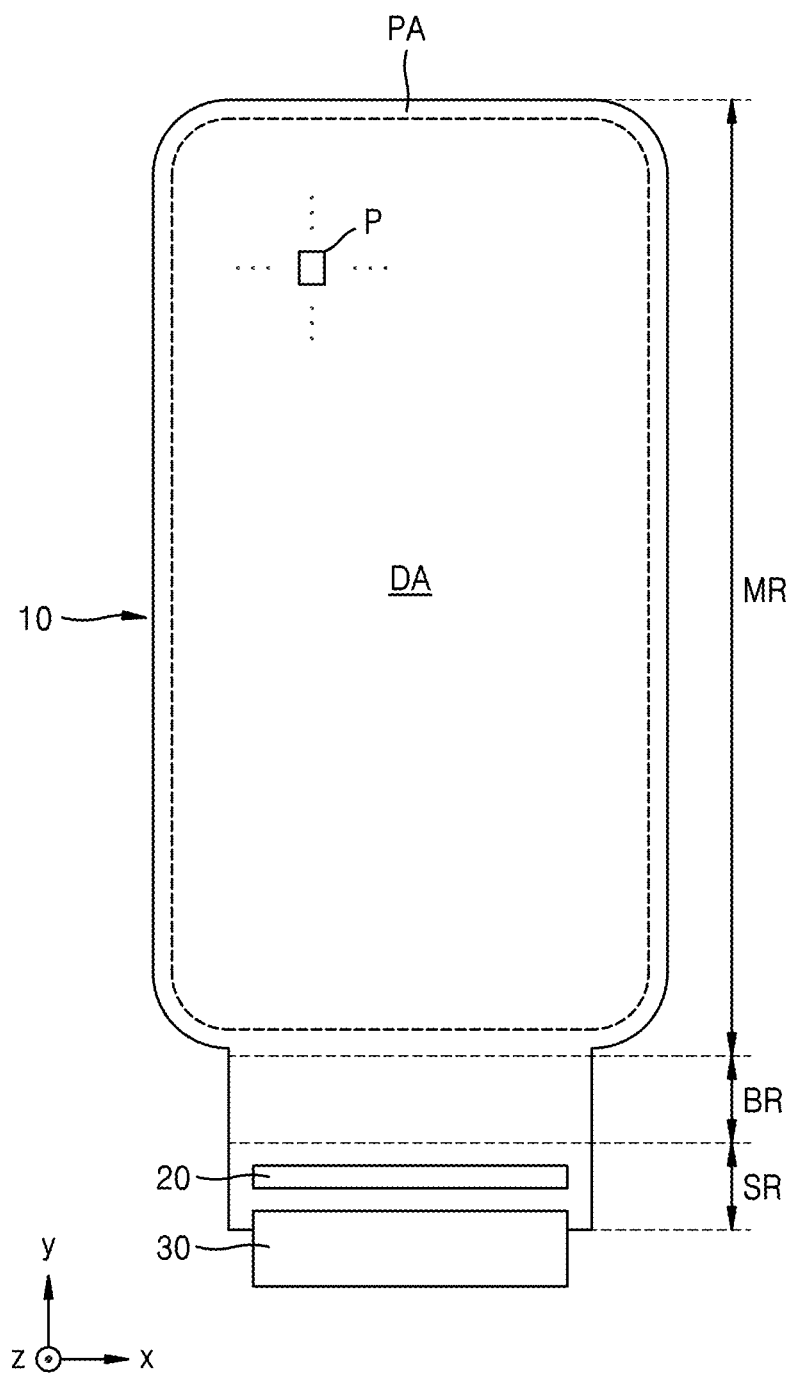
FIG. 1 is a plan view schematically illustrating a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, the disclosure is not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "connected to" another layer, region, or component, it may be "directly connected to" the other layer, region, or component and/or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
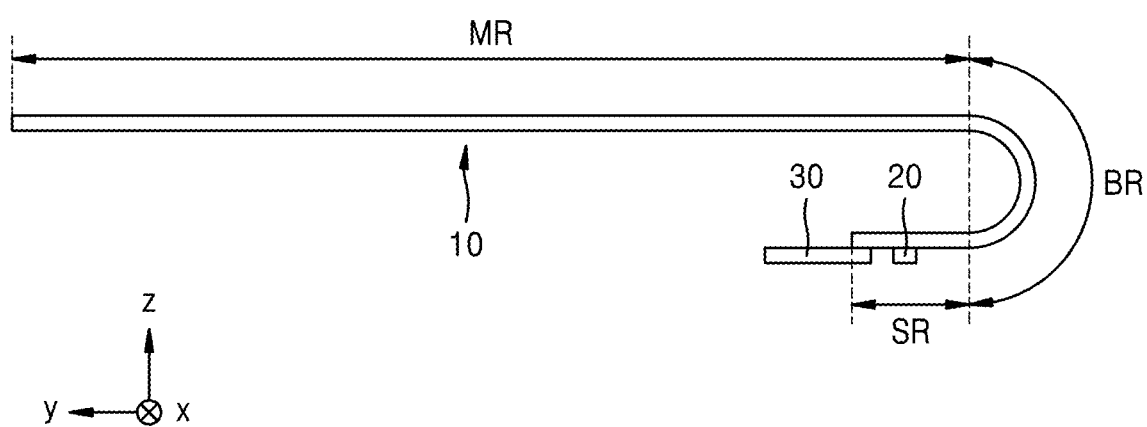
FIG. 2 is a side view schematically illustrating the display apparatus of FIG. 1.

FIG. 1 is a plan view schematically illustrating a portion of a display apparatus according to an embodiment, and FIG. 2 is a side view schematically illustrating the display apparatus of FIG. 1. In an embodiment, a portion of the display apparatus may be bent as in FIG. 2, FIG. 1 illustrates the display apparatus in an unbent states, for convenience illustration and description.

As illustrated in FIGS. 1 and 2, an embodiment of the display apparatus may include a display panel 10. The display apparatus may be of any type as long as it includes the display panel 10. In one embodiment, for example, the display apparatus may be any one of various products such as smartphones, tablets, laptops, televisions, or billboards.

The display panel 10 may include a display area DA and a peripheral area PA outside the display area DA. The display area DA may be an area for displaying an image, and a plurality of pixels P may be arranged in the display area DA. In a view in a direction substantially perpendicular to the display panel 10, the display area DA may have various shapes such as a circular shape, an elliptical shape, a polygonal shape, and a particular figure shape. FIG. 1 illustrates an embodiment where the display area DA has a substantially rectangular shape with rounded corners. The peripheral area PA may be located outside the display area DA.

In an embodiment, the display panel 10 includes a substrate 100 (see FIG. 14), and the substrate 100 may be referred to as including the display area DA and the peripheral area PA described above. Various components included in the display panel 10 may be located over (or disposed on) the substrate 100. The substrate 100 may include glass, metal, or polymer resin. In an embodiment, where the display panel 10 is bent in a bending region BR as described below, the substrate 100 may be desired to have flexible or bendable characteristics. In such an embodiment, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified such as including a multilayer structure including two layers including the polymer resin and a barrier layer located between the two layers and including an inorganic material (e.g., silicon oxide, silicon nitride, or silicon oxynitride).

A plurality of pixels P is located in the display area DA. Each of the pixels P may refer to a subpixel and may include a display device such as an organic light emitting diode OLED (see FIG. 3). The pixel P may emit, for example, red, green, blue, or white light.

In an embodiment, the display panel 10 may include a main region MR, a bending region BR outside the main region MR, and a subregion SR located opposite the main region MR with respect to the bending region BR. In an embodiment, as illustrated in FIG. 2, the display panel 10 may be bent in the bending region BR such that at least a portion of the subregion SR may overlap the main region MR in a view in a thickness direction (or the z-axis direction). However, the disclosure is not limited to a bent display apparatus and may also be applied to an unbent display apparatus. The subregion SR may be a non-display area as described below. By allowing the display panel 10 to be bent in the bending region BR, the non-display area may not be viewed when the display apparatus is viewed from the front (in the −z direction) or the size of viewed area of the non-display area may be minimized even when it is viewed.

A driving chip 20 may be arranged in the subregion SR of the display panel 10. The driving chip 20 may include an integrated circuit for driving the display panel 10. The integrated circuit may be a data driving integrated circuit for generating a data signal; however, the disclosure is not limited thereto.

The driving chip 20 may be mounted in the subregion SR of the display panel 10. The driving chip 20 may be mounted on a same surface as the display surface of the display area DA; however, as the display panel 10 is bent in the bending region BR as described above, the driving chip 20 may be located on the rear surface of the main region MR.

A printed circuit board 30 or the like may be attached to an end portion of the subregion SR of the display panel 10. The printed circuit board 30 may be electrically connected to the driving chip 20 or the like through a pad (not illustrated) on the substrate 100.

Hereinafter, for convenience of description, embodiments where the display apparatus is an organic light emitting display apparatus will be described, but the display apparatus of the disclosure is not limited thereto. In alternative embodiments, the display apparatus of the disclosure may be a display apparatus such as an inorganic light emitting display apparatus (or an inorganic EL display apparatus) or a quantum dot light emitting display apparatus. In an embodiment, an emission layer of the display device included in the display apparatus may include an organic material or an inorganic material. In an embodiment, the display apparatus may include an emission layer and quantum dots located on the path of light emitted from the emission layer.

Figure 3:
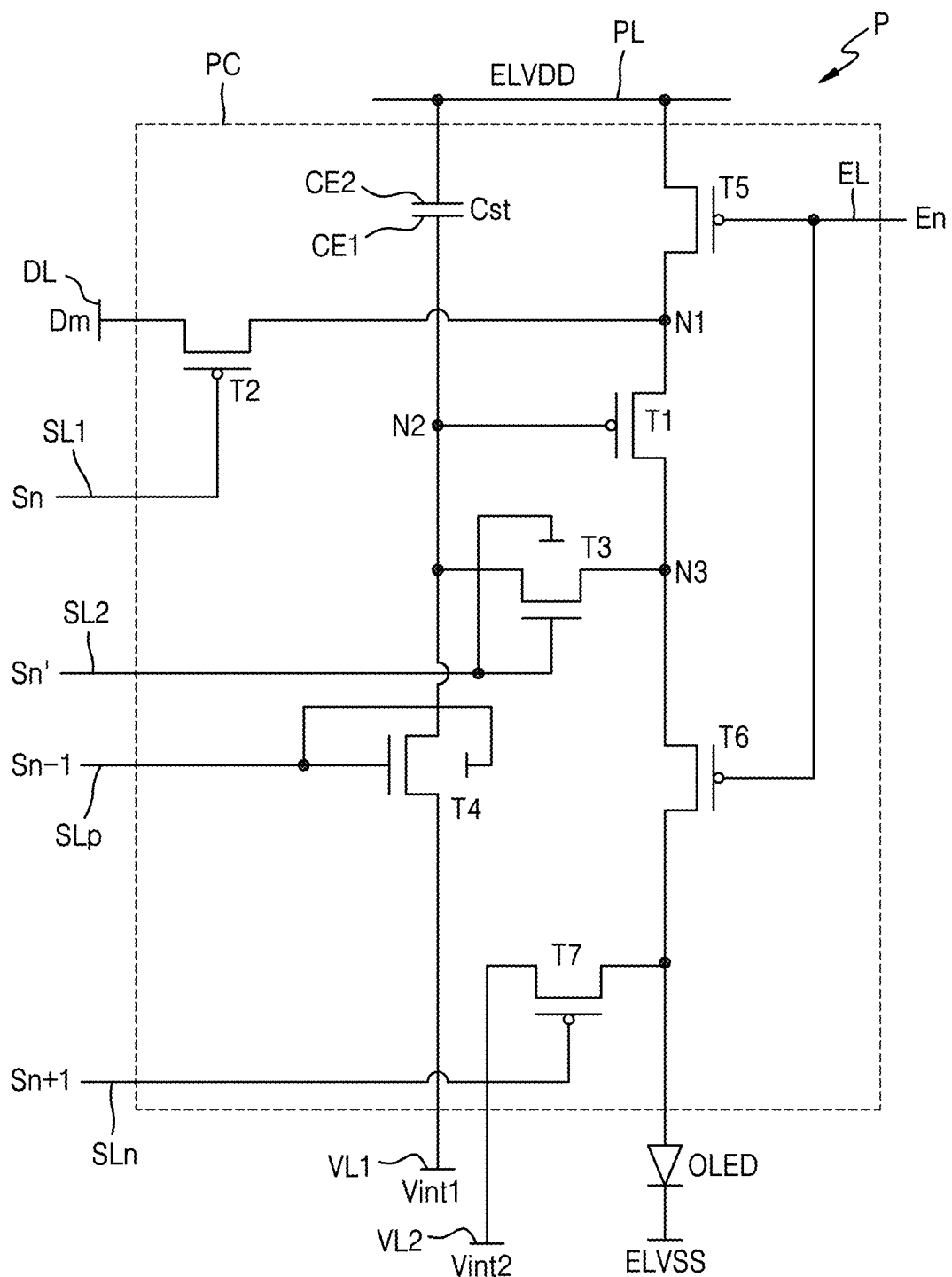
FIG. 3 is an equivalent circuit diagram of a pixel included in the display apparatus of FIG. 1.

FIG. 3 is an equivalent circuit diagram of a pixel included in the display apparatus of FIG. 1. As illustrated in FIG. 3, an embodiment of a pixel P may include a pixel circuit PC and an organic light emitting diode OLED electrically connected thereto.

As illustrated in FIG. 3, an embodiment of the pixel circuit PC may include a plurality of thin film transistors T1 to T7 and a storage capacitor Cst. The thin film transistors T1 to T7 and the storage capacitor Cst may be connected to signal lines SL1, SL2, SLp, SLn, EL, and DL, a first initialization voltage line VL1, a second initialization voltage line VL2, and a first power voltage line PL. At least one of these lines, for example, the first power voltage line PL, may be shared by adjacent pixels P.

The thin film transistors T1 to T7 may include a driving transistor T1, a writing transistor T2, a compensation transistor T3, a first initialization transistor T4, an operation control transistor T5, an emission control transistor T6, and a second initialization transistor T7.

The organic light emitting diode OLED may include a pixel electrode and an opposite electrode, the pixel electrode of the organic light emitting diode OLED may be connected to the driving transistor T1 via the emission control transistor T6 to receive a driving current, and the opposite electrode may receive a second power voltage ELVSS. The organic light emitting diode OLED may generate light of brightness corresponding to the driving current.

Some of the thin film transistors T1 to T7 may be n-channel metal oxide semiconductor ("NMOS") transistors, e.g., NMOS field effect transistors ("N-MOSFET"s) and the others may be p-channel metal oxide semiconductor ("PMOS") transistors, e.g., PMOS field effect transistors ("P-MOSFET"s). In one embodiment, for example, among the thin film transistors T1 to T7, the compensation transistor T3 and the first initialization transistor T4 may be NMOS transistors and the others may be PMOS transistors. Alternatively, among the thin film transistors T1 to T7, the compensation transistor T3, the first initialization transistor T4, and the second initialization transistor T7 may be NMOS transistors and the others may be PMOS transistors. Alternatively, all of the thin film transistors T1 to T7 may be NMOS transistors or PMOS transistors. The thin film transistors T1 to T7 may include amorphous silicon or polysilicon. In such an embodiment, the NMOS transistor may include an oxide semiconductor. Hereinafter, for convenience of description, embodiment where the compensation transistor T3 and the first initialization transistor T4 are NMOS transistors including an oxide semiconductor and the others are PMOS transistors will be described.

The signal lines may include a first scan line SL1 configured to transmit a first scan signal Sn, a second scan line SL2 configured to transmit a second scan signal Sn', a previous scan line SLp configured to transmit a previous scan signal Sn−1 to the first initialization transistor T4, a next scan line SLn configured to transmit a next scan signal Sn+1 to the second initialization transistor T7, an emission control line EL configured to transmit an emission control signal En to the operation control transistor T5 and the emission control transistor T6, and a data line DL intersecting the first scan line SL1 and configured to transmit a data signal Dm.

The first power voltage line PL may be configured to transmit a first power voltage ELVDD to the driving transistor T1, the first initialization voltage line VL1 may be configured to transmit a first initialization voltage Vint1 for initializing the driving transistor T1, and the second initialization voltage line VL2 may be configured to transmit a second initialization voltage Vint2 for initializing the pixel electrode of the organic light emitting diode OLED.

A driving gate electrode of the driving transistor T1 may be connected to the storage capacitor Cst through a second node N2, and one of the source area and the drain area of the driving transistor T1 may be connected to the first power voltage line PL through a first node N1 via the operation control transistor T5, and the other of the source area and the drain area of the driving transistor T1 may be electrically connected to the pixel electrode of the organic light emitting diode OLED through a third node N3 via the emission control transistor T6. The driving transistor T1 may receive a data signal Dm based on an operation of the writing transistor T2 to supply a driving current to the organic light emitting diode OLED.

A switching gate electrode of the writing transistor T2 may be connected to the first scan line SL1 configured to transmit the first scan signal Sn, one of the source area and the drain area of the writing transistor T2 may be connected to the data line DL, and the other of the source area and the drain area of the writing transistor T2 may be connected to the driving transistor T1 through the first node N1 and connected to the first power voltage line PL via the operation control transistor T5. The writing transistor T2 may be turned on in response to the first scan signal Sn received through the first scan line SL, to perform an operation of transmitting the data signal Dm received from the data line DL, through the first node N1 to the driving transistor T1.

A compensation gate electrode of the compensation transistor T3 may be connected to the second scan line SL2. One of the source area and the drain area of the compensation transistor T3 may be connected to the pixel electrode of the organic light emitting diode OLED through the third node N3 via the emission control transistor T6. The other of the source area and the drain area of the compensation transistor T3 may be connected to a first capacitor electrode CE1 of the storage capacitor Cst and the driving gate electrode of the driving transistor T1 through the second node N2. The compensation transistor T3 may be turned on in response to the second scan signal Sn' received through the second scan line SL2, to diode-connect the driving transistor T1.

A first initialization gate electrode of the first initialization transistor T4 may be connected to the previous scan line SLp. One of the source area and the drain area of the first initialization transistor T4 may be connected to the first initialization voltage line VL1. The other of the source area and the drain area of the first initialization transistor T4 may be connected to the first capacitor electrode CE1 of the storage capacitor Cst and the driving gate electrode of the driving transistor T1 through the second node N2. The first initialization transistor T4 may be turned on in response to the previous scan signal Sn−1 received through the previous scan line SLp, to perform an initialization operation of initializing the voltage of the driving gate electrode of the driving transistor T1 by transmitting the first initialization voltage Vint1 to the driving gate electrode of the driving transistor T1.

An operation control gate electrode of the operation control transistor T5 may be connected to the emission control line EL, one of the source area and the drain area of the operation control transistor T5 may be connected to the first power voltage line PL, and the other may be connected to the driving transistor T1 and the writing transistor T2 through the first node N1.

An emission control gate electrode of the emission control transistor T6 may be connected to the emission control line EL, one of the source area and the drain area of the emission control transistor T6 may be connected to the driving transistor T1 and the compensation transistor T3 through the third node N3, and the other of the source area and the drain area of the emission control transistor T6 may be electrically connected to the pixel electrode of the organic light emitting diode OLED.

The operation control transistor T5 and the emission control transistor T6 may be simultaneously turned on in response to the emission control signal En received through the emission control line EL such that a driving current corresponding to the voltage difference between the first power voltage ELVDD and the voltage of the driving gate electrode of the driving transistor T1 may flow through the organic light emitting diode OLED.

A second initialization gate electrode of the second initialization transistor T7 may be connected to the next scan line SLn, one of the source area and the drain area of the second initialization transistor T7 may be connected to the pixel electrode of the organic light emitting diode OLED, and the other of the source area and the drain area of the second initialization transistor T7 may be connected to the second initialization voltage line VL2 to receive the second initialization voltage Vint2. The second initialization transistor T7 may be turned on in response to the next scan signal Sn+1 received through the next scan line SLn, to initialize the pixel electrode of the organic light emitting diode OLED. The next scan line SLn may be the same as the first scan line SL1. In an embodiment, the scan line may function as the first scan line SL1 or as the next scan line SLn by transmitting the same electrical signal with a time difference. In such an embodiment, the next scan line SLn may be the first scan line of a pixel electrically connected to the data line DL, as a pixel adjacent to the pixel P illustrated in FIG. 3.

The second initialization transistor T7 may be connected to the next scan line SLn as illustrated in FIG. 3. However, the disclosure is not limited thereto, and alternatively, the second initialization transistor T7 may be connected to the emission control line EL to be driven according to the emission control signal En.

The storage capacitor Cst may include a first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the first power voltage line PL. The storage capacitor Cst may store the charge corresponding to the difference between the first power voltage ELVDD and the driving gate electrode voltage of the driving transistor T1.

An operation of each pixel P in an embodiment will hereinafter be described.

During an initialization period, when the previous scan signal Sn−1 is supplied through the previous scan line SLp, the first initialization transistor T4 may be turned on in response to the previous scan signal Sn−1 and the driving transistor T1 may be initialized by the first initialization voltage Vint1 supplied from the first initialization voltage line VL1.

During a data programming period, when the first scan signal Sn and the second scan signal Sn' are supplied through the first scan line SL1 and the second scan line SL2, the writing transistor T2 and the compensation transistor T3 may be turned on in response to the first scan signal Sn and the second scan signal Sn', such that the driving transistor T1 may be diode-connected and forward-biased by the turned-on compensation transistor T3. Then, a compensation voltage (Dm+Vth), which is obtained by subtracting a threshold voltage (−Vth) of the driving transistor T1 from the data signal Dm supplied from the data line DL, may be applied to the driving gate electrode of the driving transistor T1. The first power voltage ELVDD and the compensation voltage (Dm+Vth) may be applied to both ends of the storage capacitor Cst, and the charge corresponding to the voltage difference between both ends thereof may be stored in the storage capacitor Cst.

During a light emission period, the operation control transistor T5 and the emission control transistor T6 may be turned on by the emission control signal En supplied from the emission control line EL. A driving current may be generated according to the voltage difference between the first power voltage ELVDD and the voltage of the driving gate electrode of the driving transistor T1, and the driving current may be supplied through the emission control transistor T6 to the organic light emitting diode OLED.

In an embodiment, as described above, some of the thin film transistors T1 to T7 may include an oxide semiconductor. In one embodiment, for example, the compensation transistor T3 and the first initialization transistor T4 may include an oxide semiconductor.

In the case of polysilicon, because it has high reliability, it may be possible to accurately control an intended current to flow. Thus, in an embodiment, the driving transistor T1 directly affecting the brightness of the display apparatus may be configured to include a semiconductor layer including polysilicon having high reliability, and accordingly, a high-resolution display apparatus may be implemented. Moreover, because an oxide semiconductor may have a high carrier mobility and a low leakage current, a voltage drop thereof may not be great even when a driving time thereof is long. That is, in the case of an oxide semiconductor, low-frequency driving may be possible because a color change of an image due to a voltage drop may not be great even in low-frequency driving. Thus, in an embodiment, the compensation transistor T3 and the first initialization transistor T4 may be configured to include an oxide semiconductor to implement a display apparatus having reduced power consumption while preventing occurrence of a leakage current.

Moreover, because the oxide semiconductor may be sensitive to light, a change may occur in the current amount or the like due to external light. Thus, the external light may be absorbed or reflected by locating a metal layer under the oxide semiconductor. Accordingly, as illustrated in FIG. 3, in each of the compensation transistor T3 and the first initialization transistor T4 including an oxide semiconductor, a gate electrode may be located over (or disposed on) and under an oxide semiconductor layer. That is, in a view in a direction (z-axis direction) perpendicular to the upper surface of the substrate 100, the metal layer located under the oxide semiconductor may overlap the oxide semiconductor.

Figure 4:
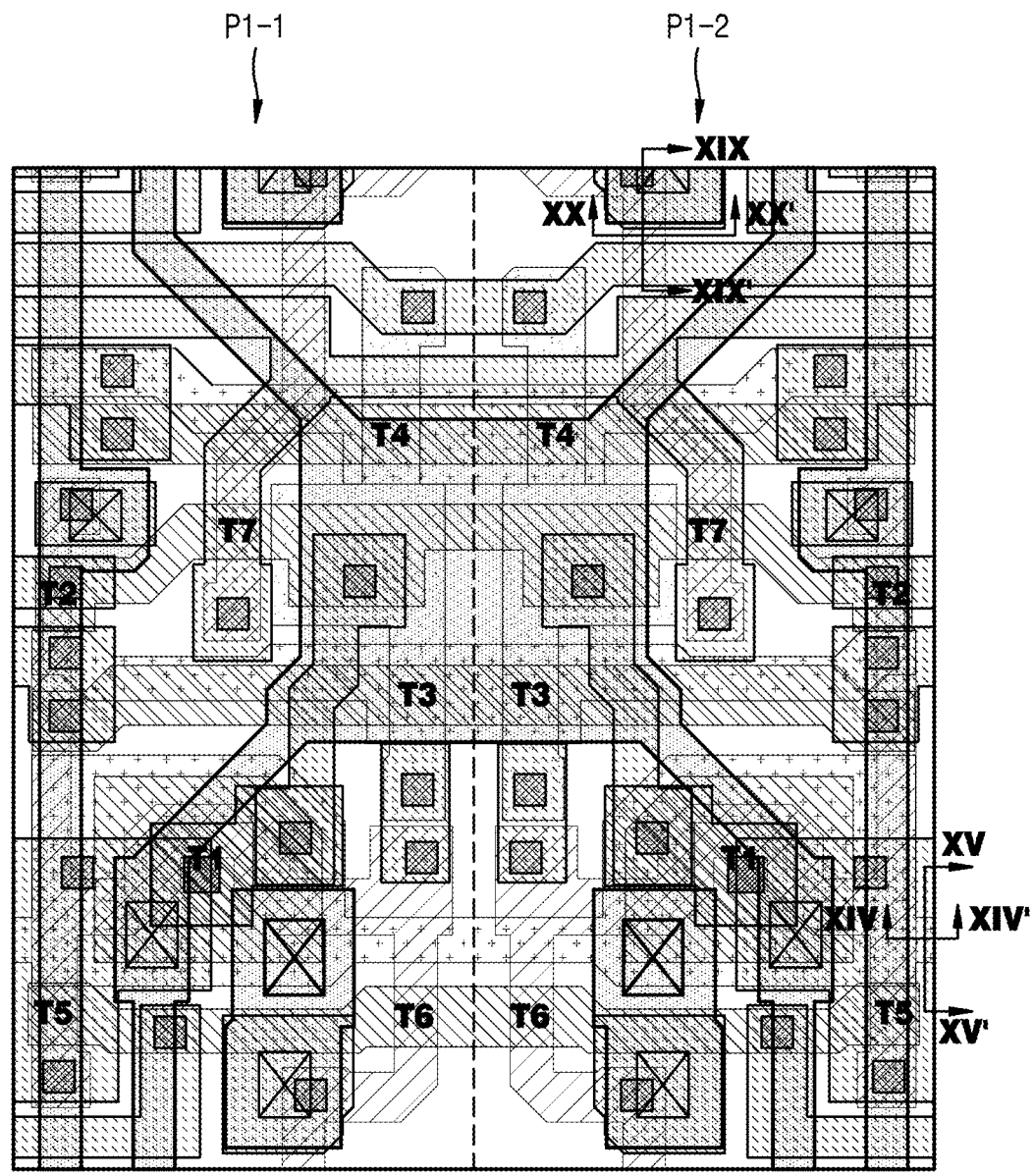
FIG. 4 is a plan view schematically illustrating positions of transistors, capacitors, and the like in pixels included in the display apparatus of FIG. 1.
Figure 12:
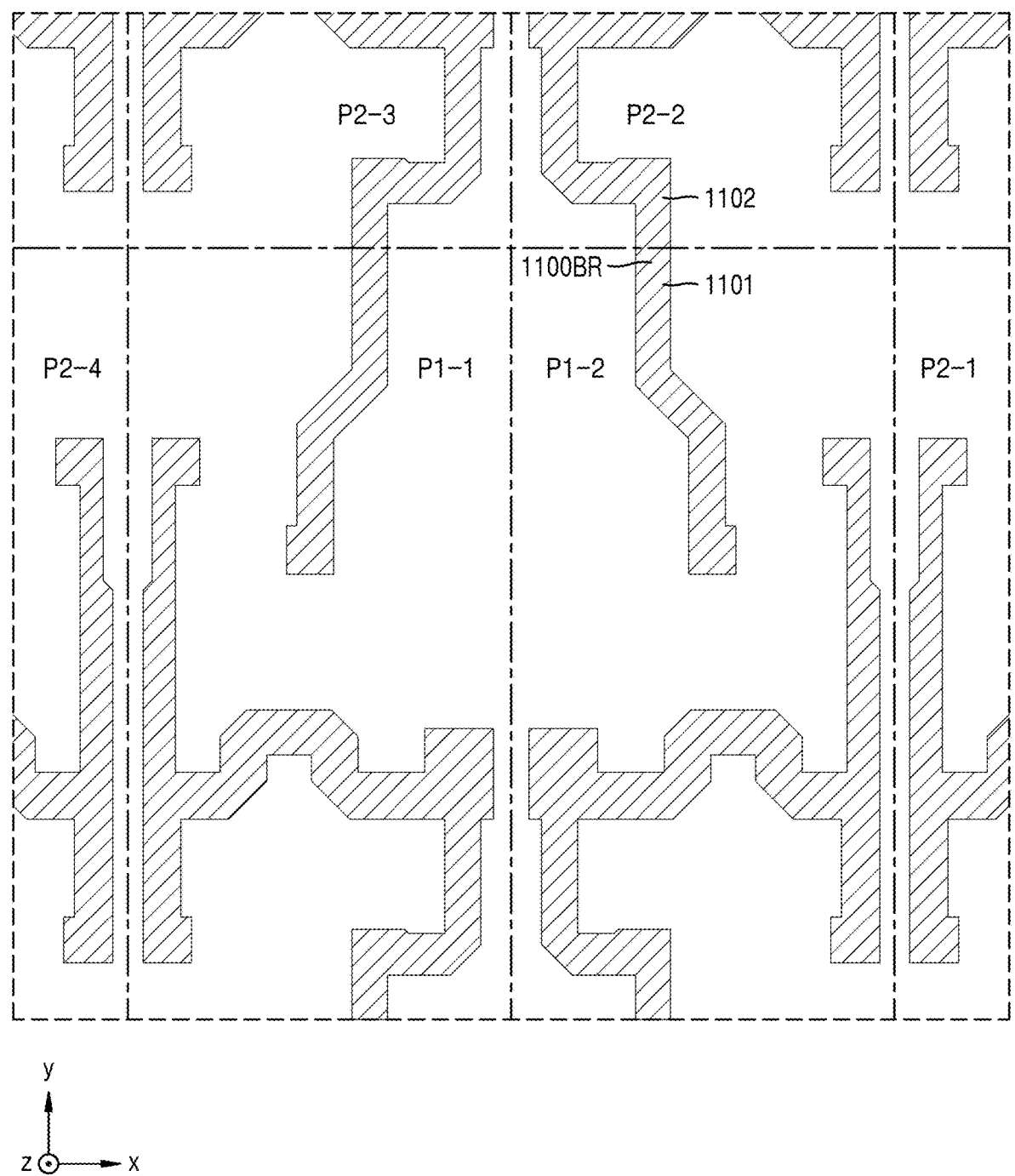
FIG. 12 is a plan view schematically illustrating, in a plurality of pixels, a semiconductor layer included in a display apparatus according to an embodiment.
Figure 13:
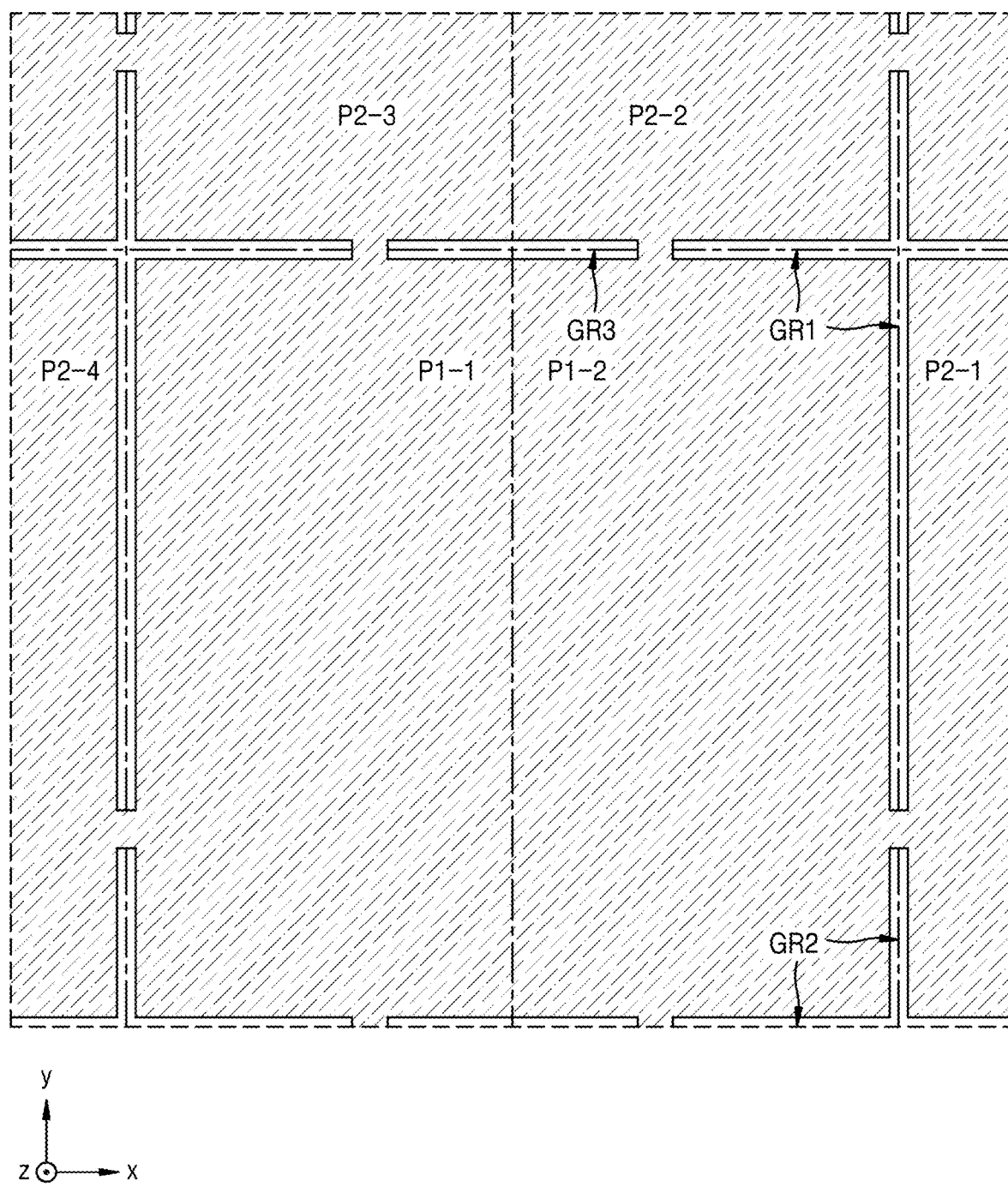
FIG. 13 is a plan view schematically illustrating, in a plurality of pixels, an insulating layer included in a display apparatus according to an embodiment.
Figure 14:
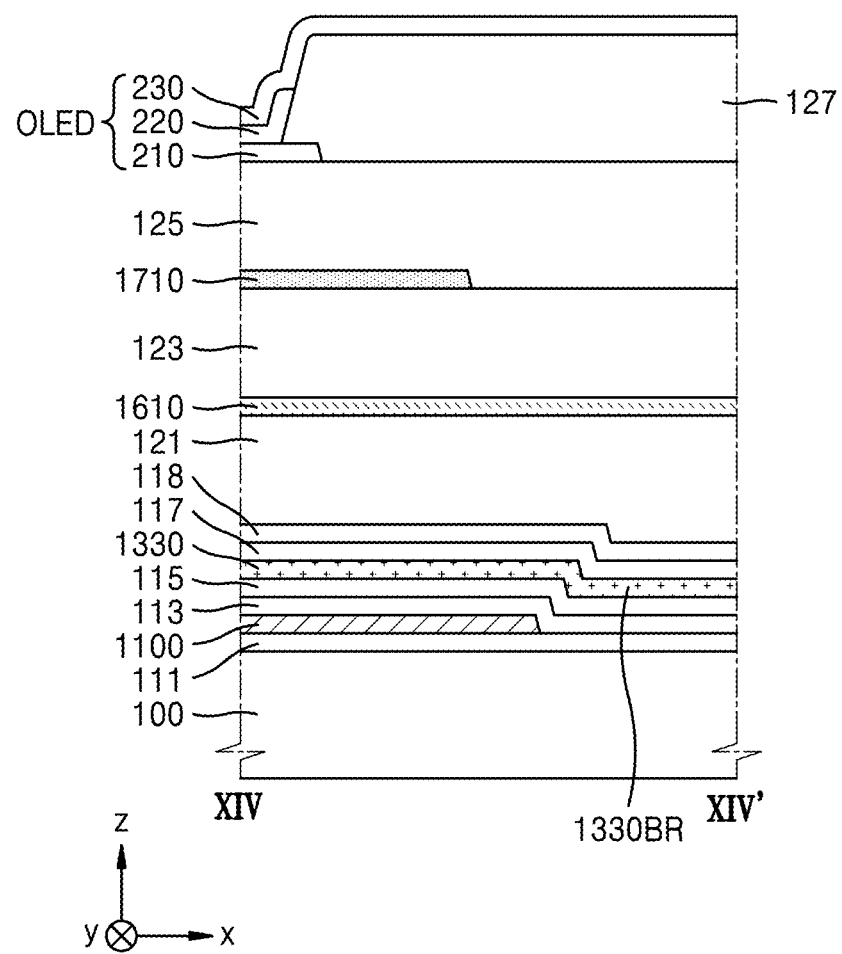
FIG. 14 is a cross-sectional view schematically illustrating a cross-section taken along line XIV-XIV' of FIG. 4.
Figure 15:
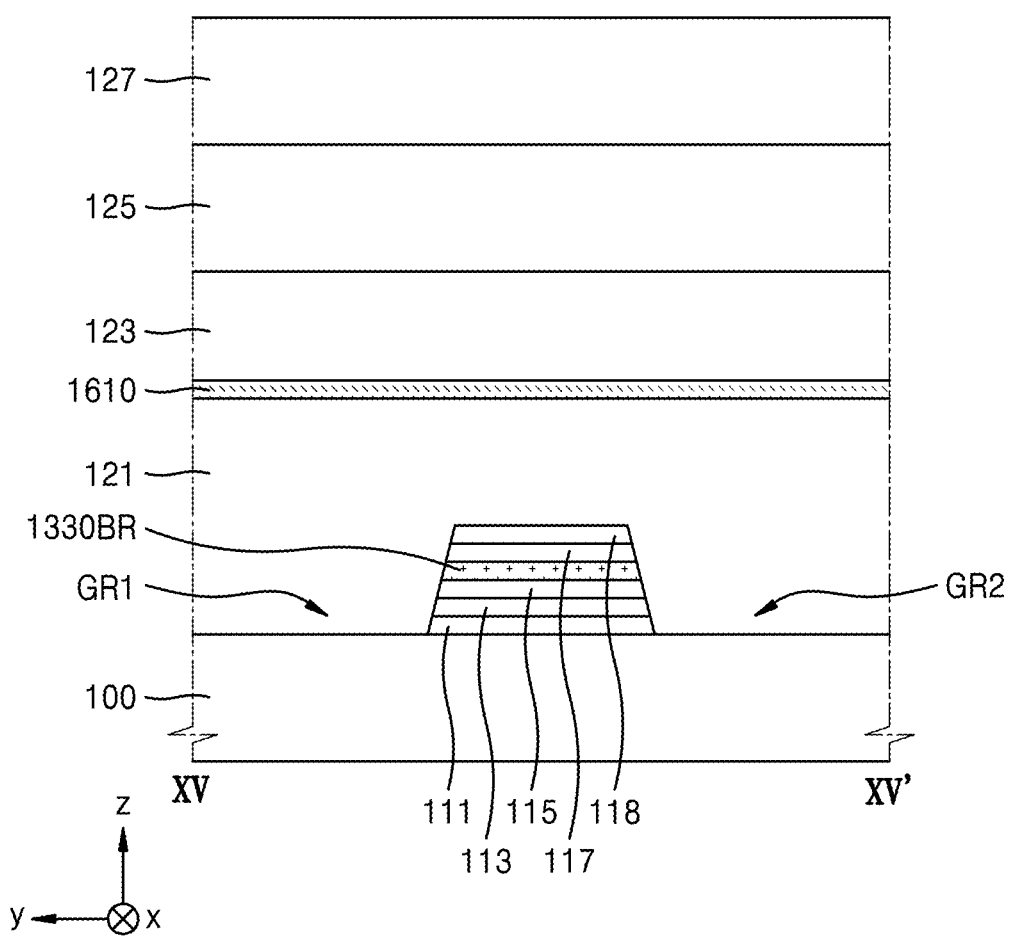
FIG. 15 is a cross-sectional view schematically illustrating a cross-section taken along line XV-XV' of FIG. 4.

FIG. 4 is a plan view schematically illustrating positions of transistors, capacitors, and the like in pixels included in the display apparatus of FIG. 1, and FIGS. 5 to 11 are plan views schematically illustrating, on a layer-by-layer basis, components such as transistors and capacitors of the display apparatus illustrated in FIG. 4. FIG. 12 is a plan view schematically illustrating, in a plurality of pixels, a semiconductor layer included in a display apparatus according to an embodiment, and FIG. 13 is a plan view schematically illustrating, in a plurality of pixels, an insulating layer included in a display apparatus according to an embodiment. FIG. 14 is a cross-sectional view schematically illustrating a cross-section taken along line XIV-XIV' of FIG. 4, and FIG. 15 is a cross-sectional view schematically illustrating a cross-section taken along line XV-XV' of FIG. 4.

As illustrated in the drawings, an embodiment of the display apparatus may include a first first pixel (hereinafter, "1-$1^{st}$ pixel") P1-1 and a second first pixel (hereinafter, "1-$2^{nd}$ pixel") P1-2 adjacent to each other. The 1-$1^{st}$ pixel P1-1 and the 1-$2^{nd}$ pixel P1-2 may be symmetrical with respect to an imaginary line, which is indicated by dotted lines, as illustrated in FIG. 4 or the like. Alternatively, the 1-$1^{st}$ pixel P1-1 and the 1-$2^{nd}$ pixel P1-2 may have a same structure instead of a symmetrical structure. The 1-$1^{st}$ pixel P1-1 may include a first first pixel circuit (hereinafter, "1-$1^{st}$ pixel circuit"), and the 1-$2^{nd}$ pixel P1-2 may include a second first pixel circuit (hereinafter, "1-$2^{nd}$ pixel circuit"). Hereinafter, for convenience of description, some conductive patterns will be described with reference to the 1-$1^{st}$ pixel circuit; however, these conductive patterns may also be symmetrically arranged in the 1-$2^{nd}$ pixel circuit.

A buffer layer 111 (see FIG. 14) including silicon oxide, silicon nitride, or silicon oxynitride may be located over or disposed on the substrate 100. The buffer layer 111 may prevent metal atoms, impurities, or the like from the substrate 100 from being diffused into a first semiconductor layer 1100 located thereover. In such an embodiment, the buffer layer 111 may control a heat supply rate during a crystallization process for forming the first semiconductor layer 1100, such that the first semiconductor layer 1100 may be uniformly crystallized.

Figure 5:
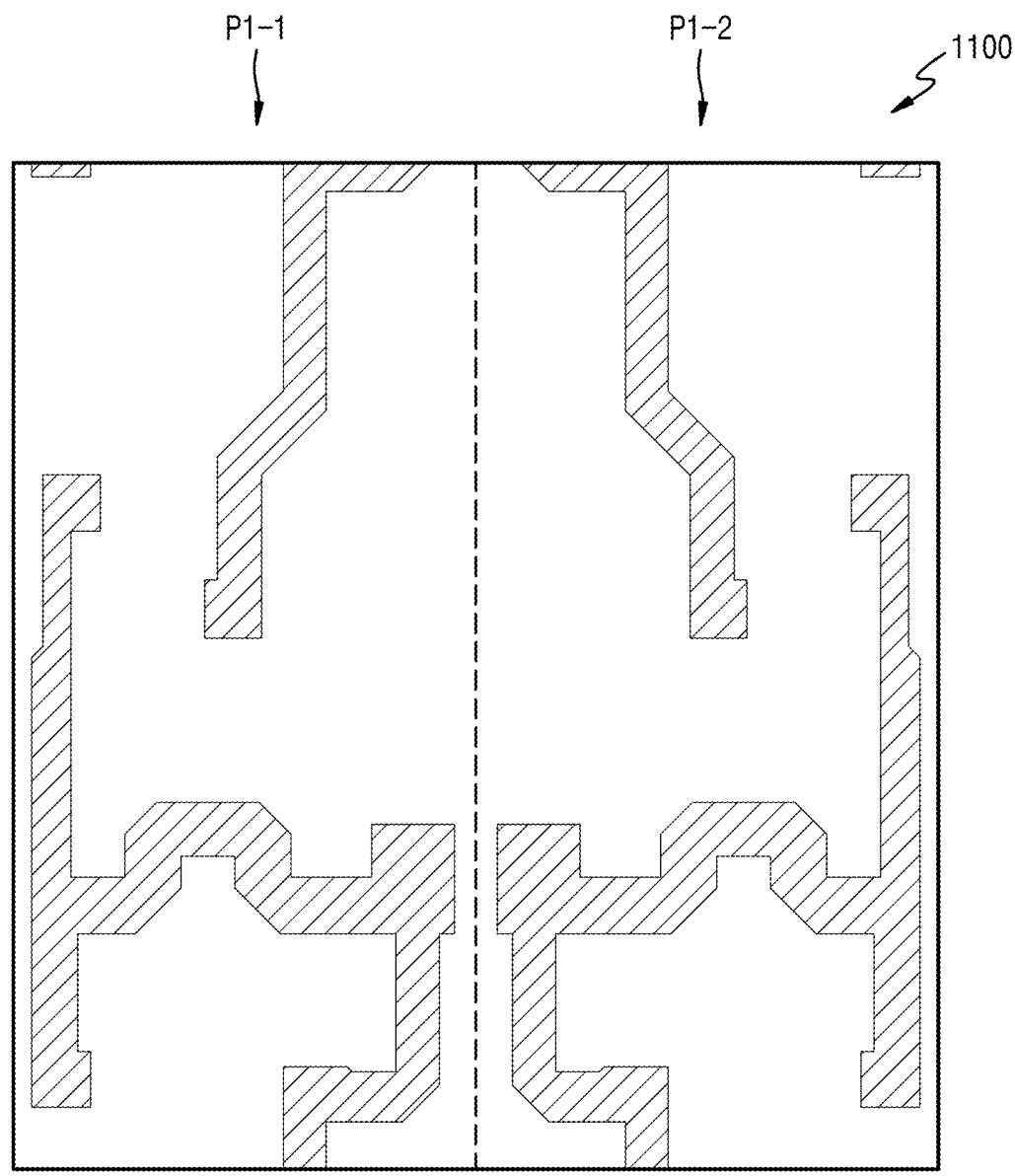
FIGS. 5 to 11 are plan views schematically illustrating, on a layer-by-layer basis, components such as transistors and capacitors of the display apparatus illustrated in FIG. 4.

The first semiconductor layer 1100 illustrated in FIG. 5 may be arranged or disposed over the buffer layer 111. The first semiconductor layer 1100 may include a silicon semiconductor. In one embodiment, for example, the first semiconductor layer 1100 may include amorphous silicon or polysilicon. In an embodiment, the first semiconductor layer 1100 may include polysilicon crystallized at low temperature. In an embodiment, ions may be selectively implanted into at least a portion of the first semiconductor layer 1100.

The driving transistor T1, the writing transistor T2, the operation control transistor T5, the emission control transistor T6, and the second initialization transistor T7 may be located along the first semiconductor layer 1100 as illustrated in FIG. 5. The driving transistor T1, the writing transistor T2, the operation control transistor T5, the emission control transistor T6, and the second initialization transistor T7 may be PMOS transistors as described above.

A first insulating layer 113 (see FIG. 14) may cover the first semiconductor layer 1100 and may be arranged or disposed over the substrate 100. The first insulating layer 113 may include an insulating material. In one embodiment, for example, the first insulating layer 113 may include silicon oxide, silicon nitride, silicon oxynitride, or aluminum oxide.

Figure 6:
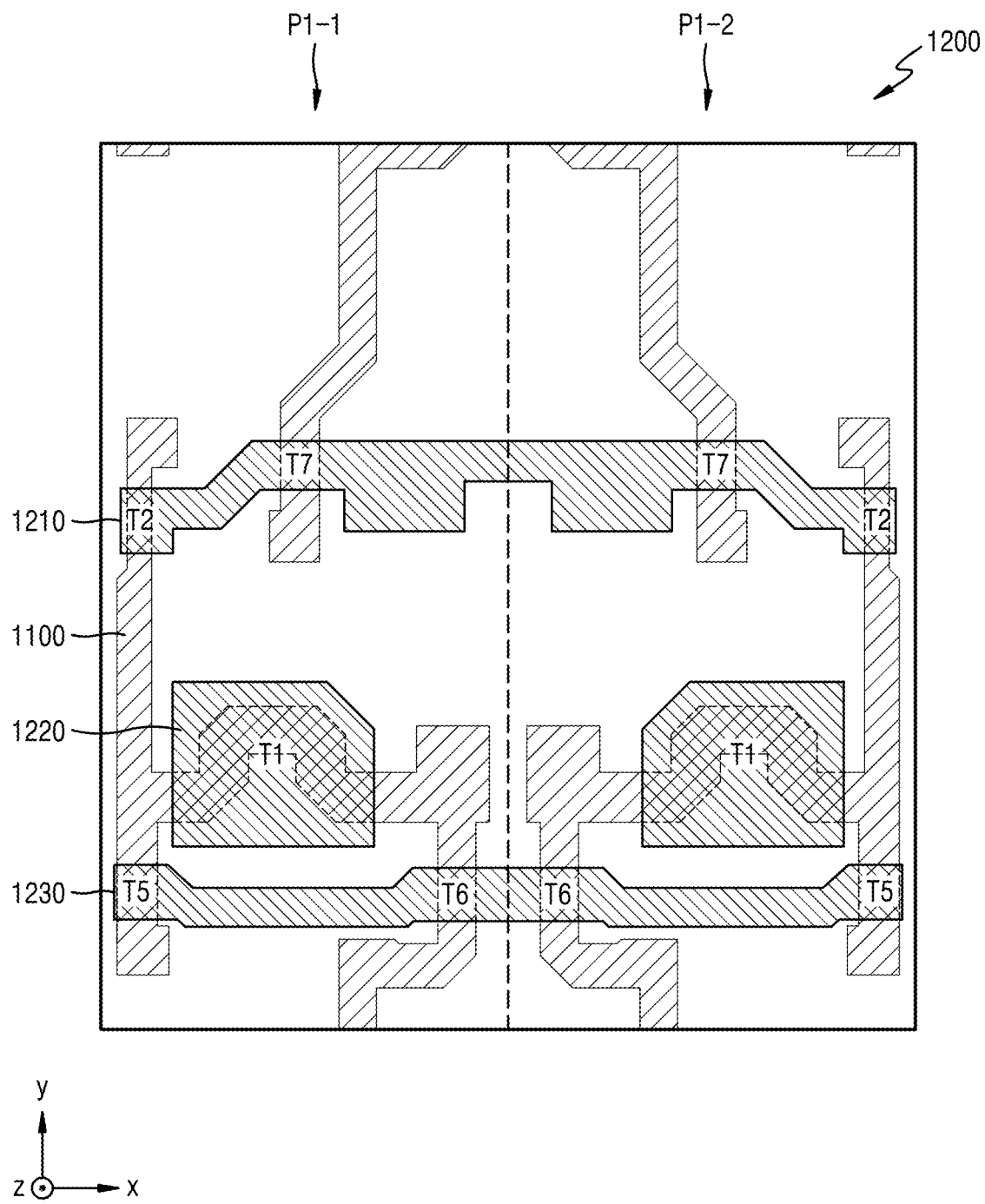

A first conductive layer 1200 illustrated in FIG. 6 may be located over or disposed on the first insulating layer 113. In FIG. 6, for convenience of illustration, the first conductive layer 1200 is illustrated together with the first semiconductor layer 1100. The first conductive layer 1200 may include a first gate line 1210, a first gate electrode 1220, and a second gate line 1230.

The first gate line 1210 may extend in a first direction (x-axis direction). The first gate line 1210 may be the first scan line SL1 or the next scan line SLn of FIG. 3. In an embodiment, as for the 1-$1^{st}$ pixel P1-1 and the 1-$2^{nd}$ pixel P1-2 as illustrated in FIG. 6, the first gate line 1210 may correspond to the first scan line SL1 of FIG. 3, and as for pixels adjacent to the 1-$1^{st}$ pixel P1-1 and the 1-$2^{nd}$ pixel P1-2 (in the +y direction), the first gate line 1210 may correspond to the next scan line SLn of FIG. 3. Accordingly, the first scan signal Sn and the next scan signal Sn+1 may be applied to the pixels through the first gate line 1210. Portions of the first gate line 1210 overlapping the first semiconductor layer 1100 may be the switching gate electrode of the writing transistor T2 and the second initialization gate electrode of the second initialization transistor T7.

The first gate electrode 1220 may have an isolated shape. The first gate electrode 1220 may be the driving gate electrode of the driving transistor T1.

The second gate line 1230 may extend in the first direction (x-axis direction). The second gate line 1230 may correspond to the emission control line EL of FIG. 3. Portions of the second gate line 1230 overlapping the first semiconductor layer 1100 may be the operation control gate electrode of the operation control transistor T5 and the emission control gate electrode of the emission control transistor T6. The emission control signal En may be applied to the pixels through the second gate line 1230.

The first conductive layer 1200 may include a metal, an alloy, a conductive metal oxide, or a transparent conductive material. In one embodiment, for example, the first conductive layer 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), or indium zinc oxide ("IZO"). The first conductive layer 1200 may have a multilayer structure; for example, the first conductive layer 1200 may have a two-layer structure of Mo/Al or a three-layer structure of Mo/Al/Mo.

A second insulating layer 115 (see FIG. 14) may cover the first conductive layer 1200 and may be located over or disposed on the first insulating layer 113. The second insulating layer 115 may include a same/similar insulating material as the first insulating layer 113.

Figure 7:
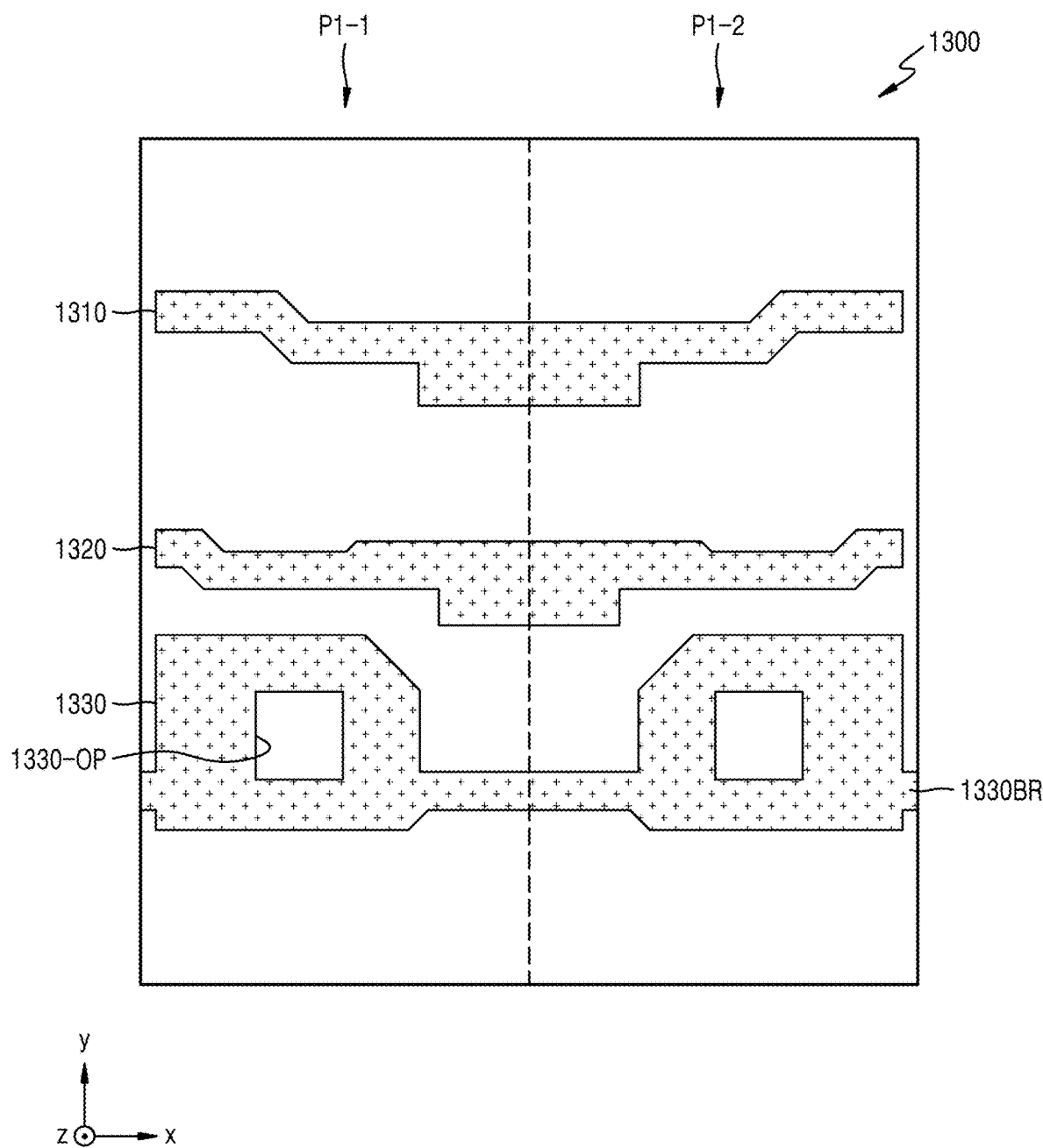

A second conductive layer 1300 illustrated in FIG. 7 may be located over or disposed on the second insulating layer 115. The second conductive layer 1300 may include a third gate line 1310, a fourth gate line 1320, and a capacitor upper electrode 1330.

The third gate line 1310 may extend in the first direction (x-axis direction). The third gate line 1310 may correspond to the previous scan line SLp of FIG. 3. In a view in a direction (z-axis direction) perpendicular to the substrate 100, the third gate line 1310 may be spaced apart from the first gate line 1210. The previous scan signal Sn−1 may be applied to the pixels through the third gate line 1310. A portion of the third gate line 1310 overlapping a second semiconductor layer 1400 described below may be a first initialization lower gate electrode of the first initialization transistor T4.

The fourth gate line 1320 may also extend in the first direction (x-axis direction). The fourth gate line 1320 may correspond to the second scan line SL2 of FIG. 3. In a view in a direction (z-axis direction) perpendicular to the substrate 100, the fourth gate line 1320 may be spaced apart from the first gate line 1210 and the third gate line 1310. The second scan signal Sn' may be applied to the pixels through the fourth gate line 1320. A portion of the fourth gate line 1320 overlapping the second semiconductor layer 1400 described below may be a compensation lower gate electrode of the compensation transistor T3.

The third gate line 1310 and the fourth gate line 1320 may be located under the second semiconductor layer 1400 described below with reference to FIG. 8 and may function as gate electrodes and may also function as a lower protection metal protecting a portion of the second semiconductor layer 1400 overlapping the third gate line 1310 and the fourth gate line 1320.

The capacitor upper electrode 1330 may overlap the first gate electrode 1220 and may extend in the first direction (x-axis direction). The capacitor upper electrode 1330 may correspond to the second capacitor electrode CE2 of FIG. 3 to form the storage capacitor Cst together with the first gate electrode 1220. The first power voltage ELVDD may be applied to the capacitor upper electrode 1330. Also, a hole passing through the capacitor upper electrode 1330 may be defined or formed in the capacitor upper electrode 1330, and at least a portion of the first gate electrode 1220 may overlap the hole.

The second conductive layer 1300 may include a metal, an alloy, a conductive metal oxide, or a transparent conductive material. In one embodiment, for example, the second conductive layer 1300 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, or IZO. The second conductive layer 1300 may have a multilayer structure; for example, the second conductive layer 1300 may have a two-layer structure of Mo/Al or a three-layer structure of Mo/Al/Mo.

A third insulating layer 117 (see FIG. 14) may cover the second conductive layer 1300 and may be located over or disposed on the second insulating layer 115. The third insulating layer 117 may include an insulating material. In one embodiment, for example, the third insulating layer 117 may include silicon oxide, silicon nitride, silicon oxynitride, or aluminum oxide.

Figure 8:
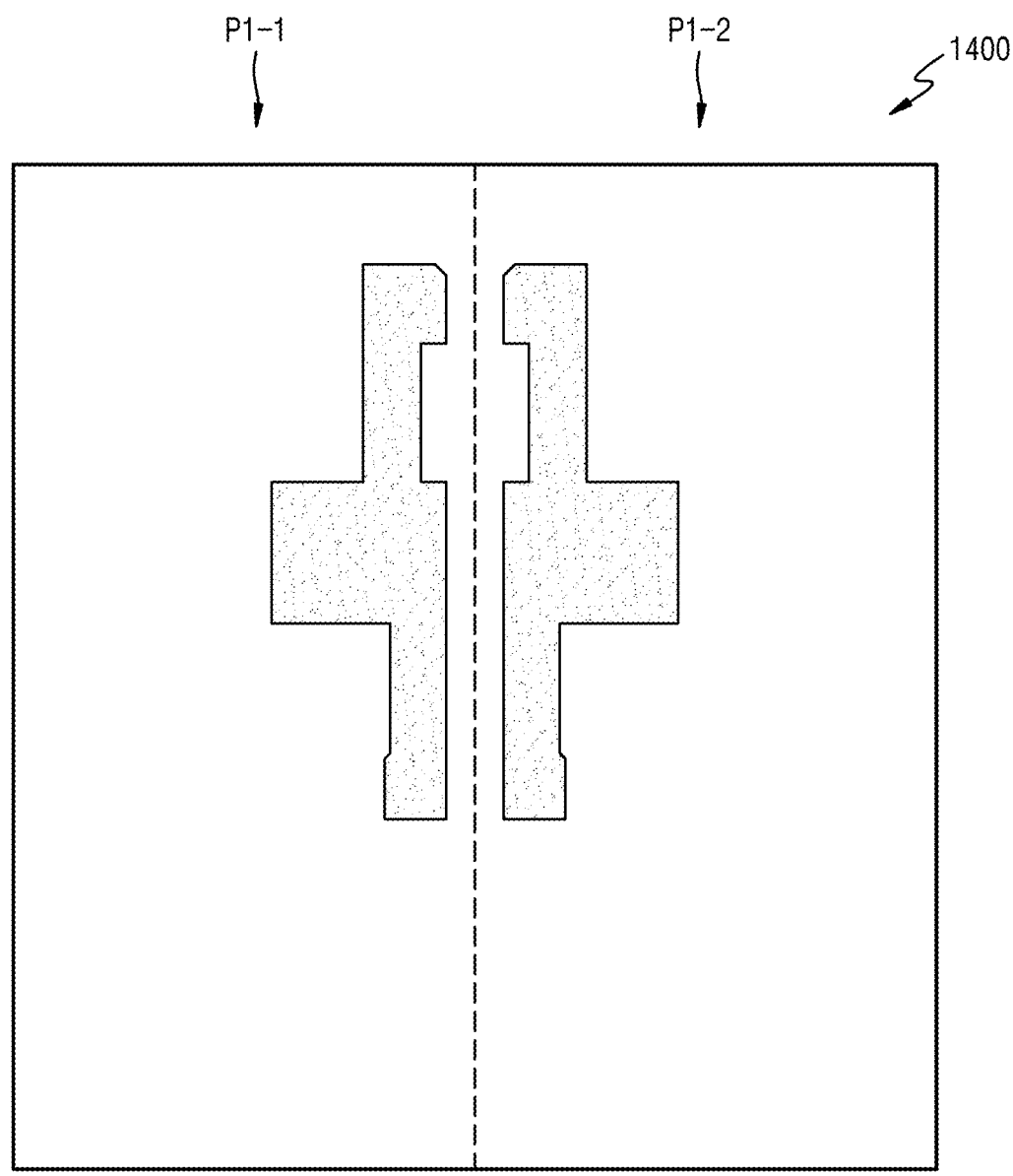

The second semiconductor layer 1400 illustrated in FIG. 8 may be located over or disposed on the third insulating layer 117. As described above, the second semiconductor layer 1400 may include an oxide semiconductor. The second semiconductor layer 1400 may be arranged in a different layer from the first semiconductor layer 1100 and may not overlap the first semiconductor layer 1100 in a view in a direction (z-axis direction) perpendicular to the substrate 100.

A fourth insulating layer 118 (see FIG. 14) may cover the second semiconductor layer 1400 and may be arranged or disposed over the third insulating layer 117. The fourth insulating layer 118 may include an insulating material. The fourth insulating layer 118 may include silicon oxide, silicon nitride, silicon oxynitride, or aluminum oxide.

Figure 9:
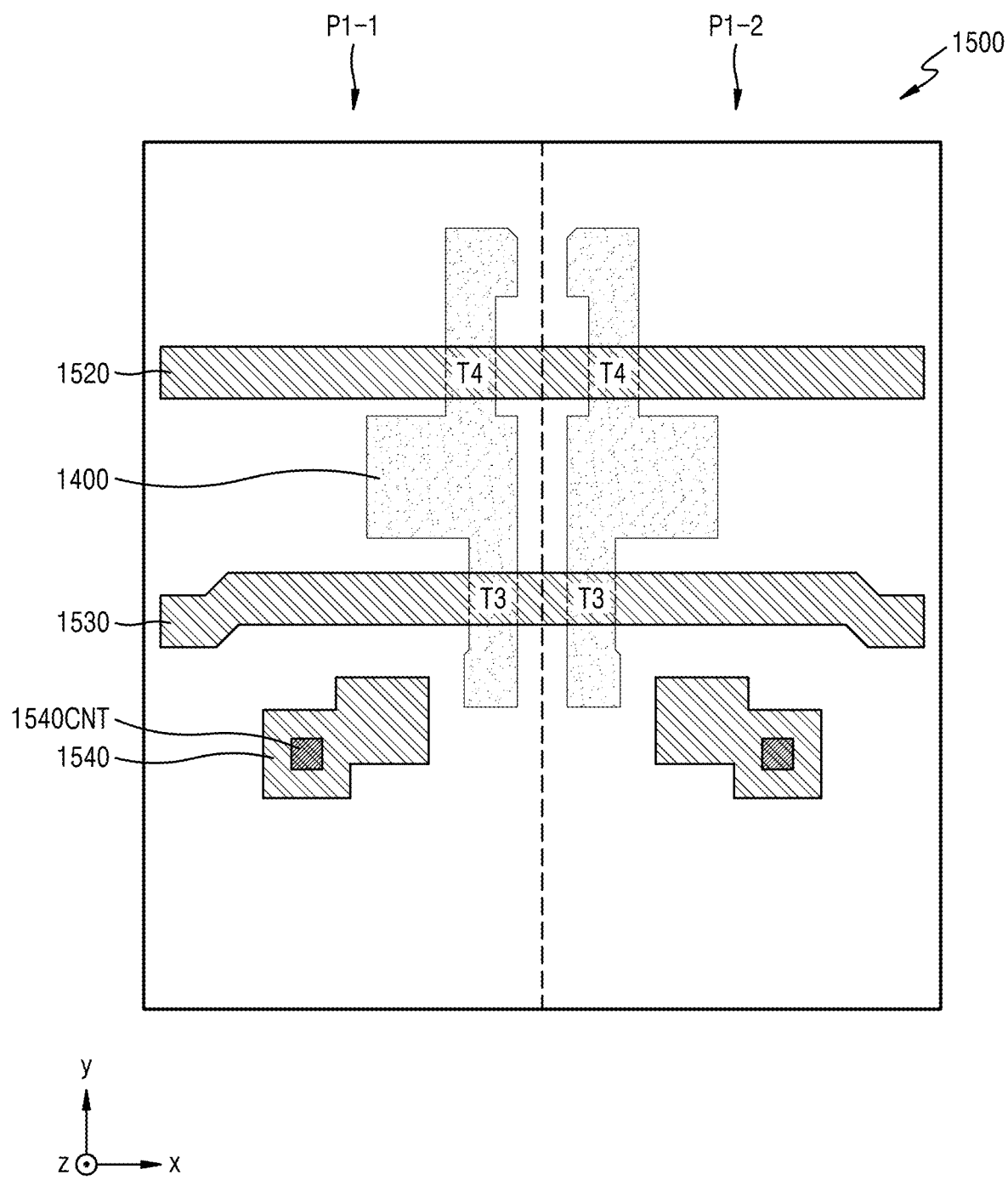

A third conductive layer 1500 illustrated in FIG. 9 may be located over or disposed on the fourth insulating layer 118. The third conductive layer 1500 may include a fifth gate line 1520, a sixth gate line 1530, and a first connection line 1540.

The fifth gate line 1520 may extend in the first direction (x-axis direction). In a view in a direction (z-axis direction) perpendicular to the substrate 100, the fifth gate line 1520 may overlap the third gate line 1310. A portion of the fifth gate line 1520 overlapping the second semiconductor layer 1400 may be a first initialization upper gate electrode of the first initialization transistor T4. The fifth gate line 1520 may be electrically connected to the third gate line 1310 as described below. Accordingly, the fifth gate line 1520 may correspond to the previous scan line SLp of FIG. 3 together with the third gate line 1310, and the previous scan signal Sn−1 may be applied to the pixels through the fifth gate line 1520 and/or the third gate line 1310.

The sixth gate line 1530 may extend in the first direction (x-axis direction). In a view in a direction (z-axis direction) perpendicular to the substrate 100, the sixth gate line 1530 may overlap the fourth gate line 1320. A portion of the sixth gate line 1530 overlapping the second semiconductor layer 1400 may be a compensation upper gate electrode of the compensation transistor T3. As described below, the sixth gate line 1530 may be electrically connected to the fourth gate line 1320. Accordingly, the sixth gate line 1530 may correspond to the second scan line SL2 of FIG. 3 together with the fourth gate line 1320, and the second scan signal Sn' may be applied to the pixels through the sixth gate line 1530 and/or the fourth gate line 1320.

The first connection line 1540 may be electrically connected to the first gate electrode 1220 as a driving gate electrode through a contact hole 1540CNT passing through an opening 1330-OP of the capacitor upper electrode 1330. The first connection line 1540 may be configured to transmit the first initialization voltage Vint1 received through the first initialization transistor T4, to the first gate electrode 1220.

The third conductive layer 1500 may include a metal, an alloy, a conductive metal oxide, or a transparent conductive material. In one embodiment, for example, the third conductive layer 1500 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, or IZO. The third conductive layer 1500 may have a multilayer structure; for example, the third conductive layer 1500 may have a two-layer structure of Mo/Al or a three-layer structure of Mo/Al/Mo.

A first planarization layer 121 (see FIG. 14) may cover the third conductive layer 1500 of FIG. 9. The first planarization layer 121 may include an organic insulating material. In one embodiment, for example, the first planarization layer 121 may include a photoresist, benzocyclobutene ("BCB"), polyimide, hexamethyldisiloxane ("HMDSO"), polymethylmethacrylate ("PMMA"), polystyrene ("PS"), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any mixture thereof.

Figure 10:
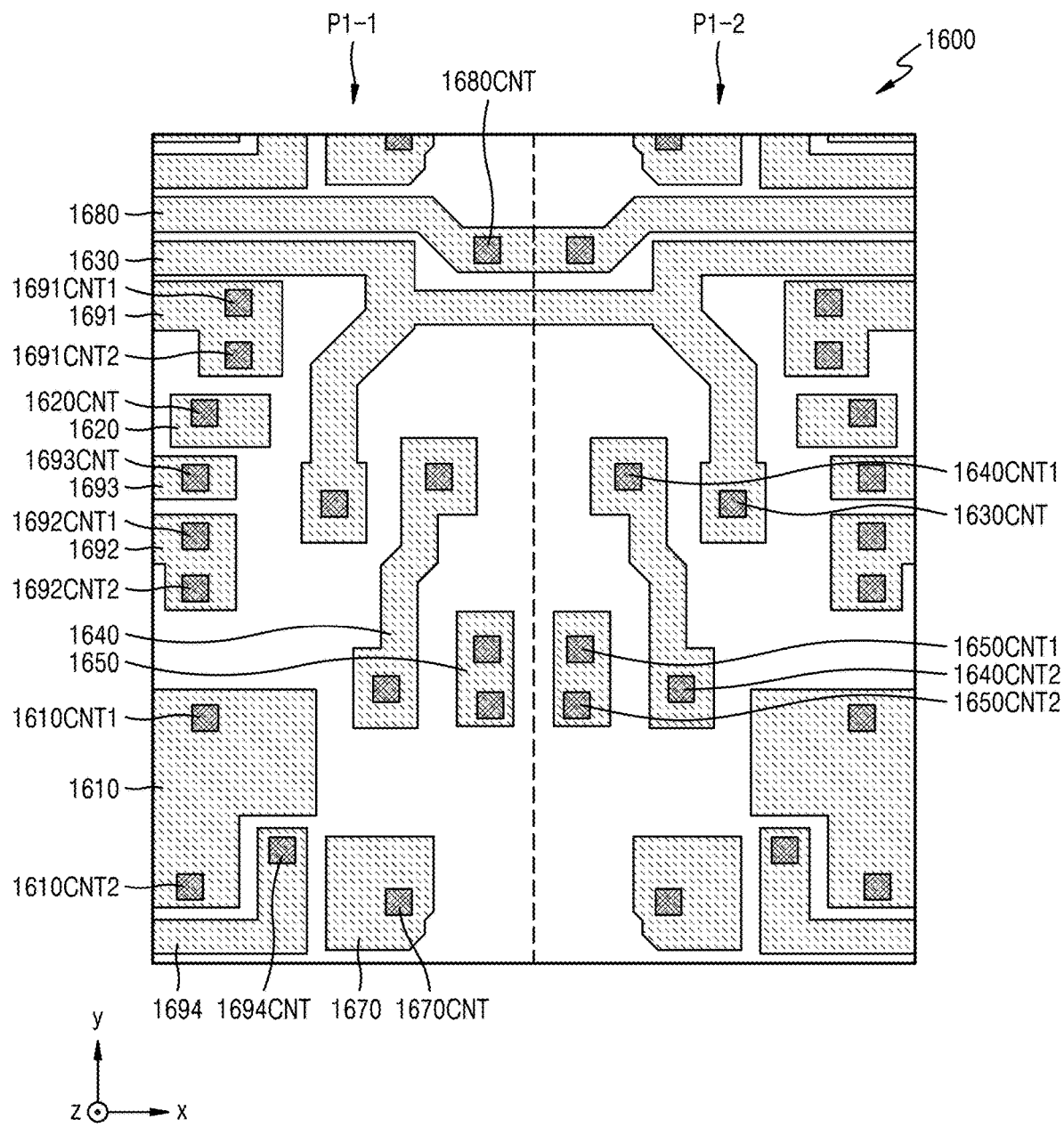

A fourth conductive layer 1600 illustrated in FIG. 10 may be located over or disposed on the first planarization layer 121. The fourth conductive layer 1600 may include a second connection line 1620, a first initialization voltage line 1680 (i.e., the first initialization voltage line VL1 of FIG. 3), a second initialization voltage line 1630 (i.e., the second initialization voltage line VL2 of FIG. 3), a third connection line 1640, a fourth connection line 1650, a fifth connection line 1670, a sixth connection line 1610, an eighth connection line 1691, a ninth connection line 1692, a tenth connection line 1693, and an eleventh connection line 1694.

The second connection line 1620 may be electrically connected to the first semiconductor layer 1100 through a contact hole 1620CNT. The data signal Dm from a data line 1710 described below with reference to FIG. 11 may be transmitted to the first semiconductor layer 1100 through the second connection line 1620 to be applied to the writing transistor T2.

The first initialization voltage line 1680 corresponding to the first initialization voltage line VL1 of FIG. 3 may extend in the first direction (x-axis direction). The first initialization voltage Vint1 may be applied to the pixels through the first initialization voltage line 1680. The first initialization voltage line 1680 may at least partially overlap the second semiconductor layer 1400 and may be electrically connected to the second semiconductor layer 1400 through a contact hole 1680CNT to transmit the first initialization voltage Vint1 to the second semiconductor layer 1400, that is, to the first initialization transistor T4.

The second initialization voltage line 1630 corresponding to the second initialization voltage line VL2 of FIG. 3 may extend in the first direction (x-axis direction). The second initialization voltage line 1630 may be configured to apply the second initialization voltage Vint2 to the pixels. The second initialization voltage line 1630 may be electrically connected to the first semiconductor layer 1100 through a contact hole 1630CNT, and the second initialization voltage Vint2 may be transmitted to the first semiconductor layer 1100 to be applied to the second initialization transistor T7.

The third connection line 1640 may electrically connect the second semiconductor layer 1400 to the first connection line 1540 through contact holes 1640CNT1 and 1640CNT2 defined in one side and the other side portions thereof. The first initialization voltage Vint1 may be transmitted to the first gate electrode 1220 as a driving gate electrode through the second semiconductor layer 1400, the third connection line 1640, and the first connection line 1540.

The fourth connection line 1650 may electrically connect the second semiconductor layer 1400 to the first semiconductor layer 1100 through contact holes 1650CNT1 and 1650CNT2 defined in one side and the other side portions thereof. That is, the fourth connection line 1650 may electrically connect the compensation transistor T3 to the driving transistor T1.

The fifth connection line 1670 may be electrically connected to the first semiconductor layer 1100 through a contact hole 1670CNT. The fifth connection line 1670 may be configured to transmit the driving current or the second initialization voltage Vint2 from the first semiconductor layer 1100 to the organic light emitting diode OLED.

The sixth connection line 1610 may be connected to a power voltage line 1730 described below with reference to FIG. 11, to transmit the first power voltage ELVDD from the power voltage line 1730 through a contact hole 1610CNT1 to the capacitor upper electrode 1330 (i.e., the second capacitor electrode CE2 of FIG. 3). Also, the sixth connection line 1610 may be configured to transmit the first power voltage ELVDD from the power voltage line 1730 through the contact hole 1610CNT2 to the first semiconductor layer 1100, particularly, to the operation control transistor T5.

The eighth connection line 1691 may be connected to the third gate line 1310 through a contact hole 1691CNT1 and connected to the fifth gate line 1520 through a contact hole 1691CNT2 to electrically connect the third gate line 1310 to the fifth gate line 1520. Also, the eighth connection line 1691 may electrically connect the third gate line 1310 of the 1-1$^{st}$ pixel P1-1 to the third gate line 1310 of the pixel located in the opposite direction (−x direction) of the 1-1$^{st}$ pixel P1-1 with respect to the 1-2$^{nd}$ pixel P1-2. Also, the eighth connection line 1691 may electrically connect the fifth gate line 1520 of the 1-1$^{st}$ pixel P1-1 to the fifth gate line 1520 of the pixel located in the opposite direction (−x direction) of the 1-1$^{st}$ pixel P1-1 with respect to the 1-2$^{nd}$ pixel P1-2.

The ninth connection line 1692 may be connected to the fourth gate line 1320 through a contact hole 1692CNT1 and connected to the sixth gate line 1530 through a contact hole 1692CNT2 to electrically connect the fourth gate line 1320 to the sixth gate line 1530. Also, the ninth connection line 1692 may electrically connect the fourth gate line 1320 of the 1-1$^{st}$ pixel P1-1 to the fourth gate line 1320 of the pixel located in the opposite direction (−x direction) of the 1-1$^{st}$ pixel P1-1 with respect to the 1-2$^{nd}$ pixel P1-2. Also, the ninth connection line 1692 may electrically connect the sixth gate line 1530 of the 1-1$^{st}$ pixel P1-1 to the sixth gate line 1530 of the pixel located in the opposite direction (−x direction) of the 1-1$^{st}$ pixel P1-1 with respect to the 1-2$^{nd}$ pixel P1-2.

The tenth connection line 1693 may electrically connect the first gate line 1210 of the 1-1$^{st}$ pixel P1-1 to the first gate line 1210 of the pixel located in the opposite direction (−x direction) of the 1-1$^{st}$ pixel P1-1 with respect to the 1-2$^{nd}$ pixel P1-2 through a contact hole 1693CNT. The eleventh connection line 1694 may electrically connect the second gate line 1230 of the 1-1$^{st}$ pixel P1-1 to the second gate line 1230 of the pixel located in the opposite direction (−x direction) of the 1-1$^{st}$ pixel P1-1 with respect to the 1-2$^{nd}$ pixel P1-2 through a contact hole 1694CNT.

The fourth conductive layer 1600 may include a metal, an alloy, a conductive metal oxide, or a transparent conductive material. In one embodiment, for example, the fourth conductive layer 1600 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, or IZO. The fourth conductive layer 1600 may have a multilayer structure; for example, the fourth conductive layer 1600 may have a two-layer structure of Ti/Al or a three-layer structure of Ti/Al/Ti.

A second planarization layer 123 may cover the fourth conductive layer 1600 and may be located over or disposed on the first planarization layer 121. The second planarization layer 123 may include an organic insulating material. In one embodiment, for example, the second planarization layer 123 may include a photoresist, BCB, polyimide, HMDSO, PMMA, PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any mixture thereof.

Figure 11:
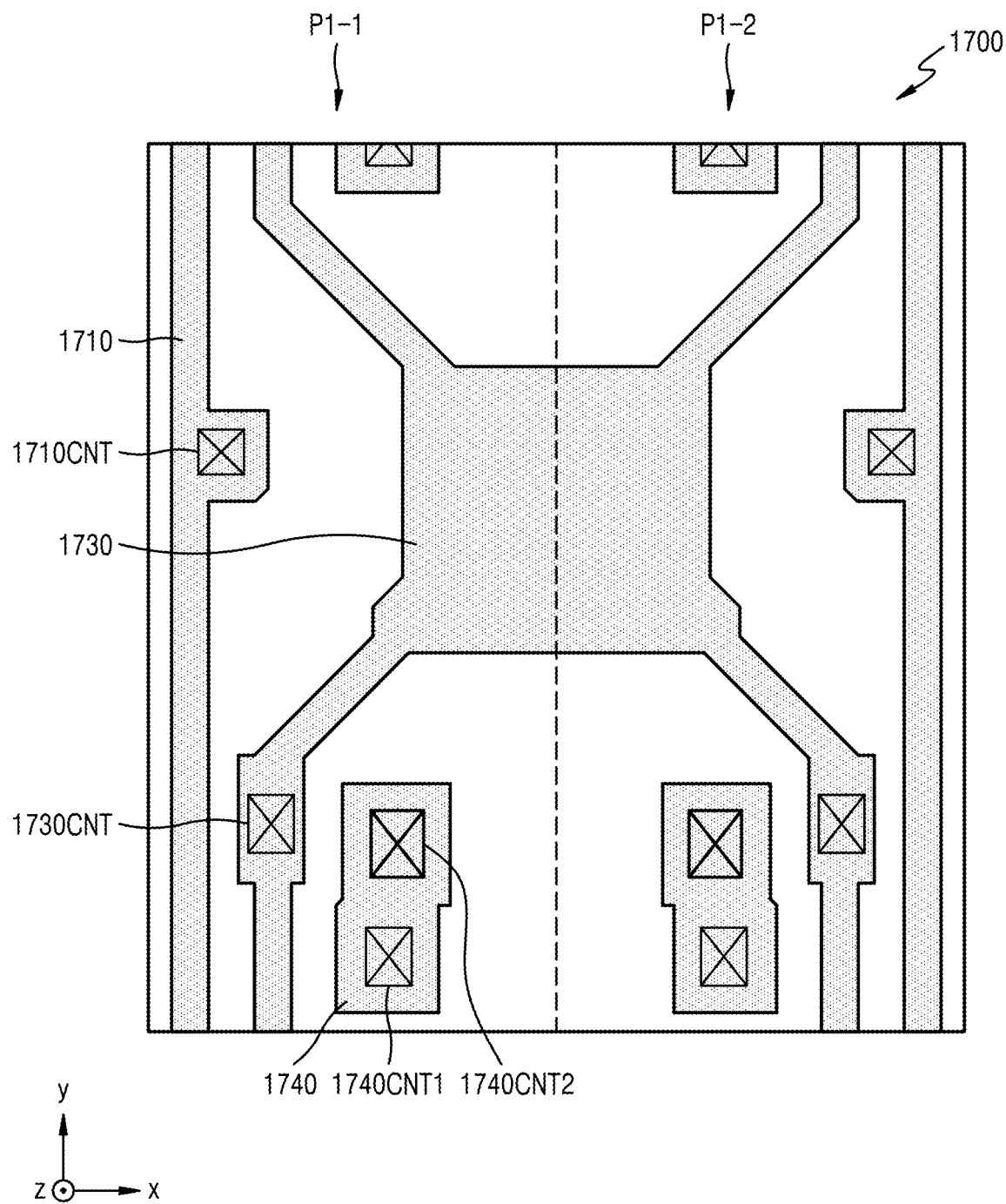

A fifth conductive layer 1700 illustrated in FIG. 11 may be located over or disposed on the second planarization layer 123. The fifth conductive layer 1700 may include a data line 1710, a power voltage line 1730, and a seventh connection line 1740.

The data line 1710 may extend in a second direction (y-axis direction). The data line 1710 may correspond to the data line DL of FIG. 3. The data line 1710 may be electrically connected to the second connection line 1620 through a contact hole 1710CNT and thus the data signal Dm from the data line 1710 may be transmitted to the first semiconductor layer 1100 through the second connection line 1620 and applied to the writing transistor T2.

The power voltage line 1730 may extend substantially in the second direction (y-axis direction). The power voltage line 1730 may correspond to the first power voltage line PL of FIG. 3. The power voltage line 1730 may be configured to apply the first power voltage ELVDD to the pixels. The power voltage line 1730 may be electrically connected to the sixth connection line 1610 through a contact hole 1730CNT to transmit the first power voltage ELVDD to the operation control transistor T5 and the capacitor upper electrode 1330 as described above. The power voltage line 1730 of the 1-1$^{st}$ pixel P1-1 may be integrally formed as a single unitary unit with the power voltage line 1730 of the 1-2$^{nd}$ pixel P1-2 adjacent thereto.

The seventh connection line 1740 may be electrically connected to the fifth connection line 1670 through a contact hole 1740CNT1. Also, the seventh connection line 1740 may be electrically connected to a pixel electrode 210 (see FIG. 14) of the organic light emitting diode OLED through a contact hole 1740CNT2 formed in an insulating layer located thereover. Accordingly, the driving current or the second initialization voltage Vint2 from the first semiconductor layer 1100 may be transmitted through the fifth connection line 1670 and the seventh connection line 1740 to the pixel electrode 210 of the organic light emitting diode OLED.

The fifth conductive layer 1700 may include a metal, an alloy, a conductive metal oxide, or a transparent conductive material. In one embodiment, for example, the fifth conductive layer 1700 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, or IZO. The fifth conductive layer 1700 may have a multilayer structure; for example, the fifth conductive layer 1700 may have a two-layer structure of Ti/Al or a three-layer structure of Ti/Al/Ti.

When an external impact is applied to the display apparatus, a crack may occur in an insulating layer including an inorganic material inside the display apparatus. Also, such a crack generated in a pixel area may grow along the insulating layer including the inorganic material inside the display apparatus and extend to an adjacent pixel area. Accordingly, a defect may occur in a plurality of pixels due to the external impact. In an embodiment of the invention, the display apparatus may prevent or minimize the growth of such a crack.

As illustrated in FIG. 13, the insulating layer including an inorganic material may include grooves GR1, GR2, and GR3 or openings. A portion of a first groove GR1 or a first opening may correspond to the boundary between an area of the 1-2$^{nd}$ pixel P1-2 and an area of a first second pixel (hereinafter, "2-1$^{st}$ pixel") P2-1 located in the opposite direction (+x direction) of the 1-2$^{nd}$ pixel P1-2 with respect to the 1-1$^{st}$ pixel P1-1. Another portion of the first groove GR1 or the first opening may correspond to the boundary between an area of the 1-2$^{nd}$ pixel P1-2 and an area of a second second pixel (hereinafter, "2-2$^{nd}$ pixel") P2-2 (located in the +y direction). A portion of a second groove GR2 or a second opening spaced apart from the first groove GR1 or the first opening may also correspond to the boundary between an area of the 1-2$^{nd}$ pixel P1-2 and an area of the 2-1$^{st}$ pixel P2-1 located in the opposite direction (+x direction) of the 1-2$^{nd}$ pixel P1-2 with respect to the 1-1$^{st}$ pixel P1-1. A third groove GR3 or a third opening may be spaced apart from the first groove GR1 or the first opening and may correspond to the boundary between an area of the 1-2$^{nd}$ pixel P1-2 and an area of the 2-2$^{nd}$ pixel P2-2 (located in the +y direction).

Similarly, a portion of a first groove GR1 or a first opening may correspond to the boundary between an area of the 1-1$^{st}$ pixel P1-1 and an area of a fourth second pixel (hereinafter, "2-4$^{th}$ pixel") P2-4 located in the opposite direction (−x direction) of the 1-1$^{st}$ pixel P1-1 with respect to the 1-2$^{nd}$ pixel P1-2. Another portion of the first groove GR1 or the first opening may correspond to the boundary between an area of the 1-1$^{st}$ pixel P1-1 and an area of a third second pixel (hereinafter, "2-3$^{rd}$ pixel") P2-3 (located in the +y direction). A portion of a second groove GR2 or a second opening spaced apart from the first groove GR1 or the first opening may also correspond to the boundary between an area of the 1-1$^{st}$ pixel P1-1 and an area of the 2-4$^{th}$ pixel P2-4 located in the opposite direction (−x direction) of the 1-1$^{st}$ pixel P1-1 with respect to the 1-2$^{nd}$ pixel P1-2. A third groove GR3 or a third opening may be spaced apart from the first groove GR1 or the first opening and may correspond to the boundary between an area of the 1-1$^{st}$ pixel P1-1 and an area of the 2-3$^{rd}$ pixel P2-3 (located in the +y direction).

Here, the term "groove" may refer to a groove formed in the insulating layer, and the depth of the groove may be less than the thickness of the insulating layer. The opening may refer to an opening penetrating the insulating layer vertically (in the z-axis direction). The insulating layer may include an opening or a groove, and for convenience, a case where the insulating layer includes a groove will be described below.

A crack may be formed in the insulating layer in an area of the 1-2$^{nd}$ pixel P1-2 due to an external impact. However, in an embodiment, as illustrated in FIG. 13, the insulating layer including an inorganic material includes first to third grooves GR1, GR2, and GR3, such that such a crack may reach the first groove GR1 or the second groove GR2 while growing in the direction to the 2-1$^{st}$ pixel P2-1 and accordingly, the crack may not grow into an area of the 2-1$^{st}$ pixel P2-1. In such an embodiment, the crack may reach the first groove GR1 or the third groove GR3 while growing in the direction to the 2-2$^{nd}$ pixel P2-2 and accordingly, the crack may not grow into an area of the 2-2$^{nd}$ pixel P2-2. In such an embodiment, the display apparatus may effectively prevent or minimize the growth of a crack, which may occur in the insulating layer including an inorganic material in a pixel due to an external impact, into an adjacent pixel.

In an embodiment, instead of simultaneously forming a portion of the first groove GR1 in the x-axis direction and a portion of the first groove GR1 in the y-axis direction, one of the portions may be formed through an etching process and then the other of the portions may be formed through another etching process. In an embodiment, etching may be excessively performed at a point where portion of the first groove GR1 in the x-axis direction and a portion of the first groove GR1 in the y-axis direction meet each other. In such an embodiment, a bottom metal layer or the like may be provided under the inorganic insulating layer to effectively prevent damage to the substrate 100 or the like thereunder due to excessive etching. Alternatively, such an over-etch preventing layer may be formed by using the first conductive layer 1200 instead of the bottom metal layer.

The insulating layer illustrated in FIG. 13 may be the buffer layer 111, the first insulating layer 113, the second insulating layer 115, the third insulating layer 117, or the fourth insulating layer 118.

In an embodiment, in the boundary between an area of the 1-2$^{nd}$ pixel P1-2 and an area of the 2-1$^{st}$ pixel P2-1 located in the opposite direction (+x direction) of the 1-2$^{nd}$ pixel P1-2 with respect to the 1-1$^{st}$ pixel P1-1, the first groove GR1 and the second groove GR2 may be spaced apart from each other. As illustrated in FIG. 7, the second conductive layer 1300 may include a capacitor upper electrode 1330 in an area of the 1-2$^{nd}$ pixel P1-2. The capacitor upper electrode 1330 may also be located in an area of the 2-1$^{st}$ pixel P2-1 located in the opposite direction (+x direction) to the 1-2$^{nd}$ pixel P1-2 with respect to the 1-1$^{st}$ pixel P1-1. The capacitor upper electrode 1330 of the 1-2$^{nd}$ pixel P1-2 may be connected to the capacitor upper electrode 1330 of the 2-1$^{st}$ pixel P2-1 by a bridge 1330BR. The capacitor upper electrode 1330 of the 1-2$^{nd}$ pixel P1-2 may be referred to as a first first conductive pattern (hereinafter "1-1$^{st}$ conductive pattern"), and the capacitor upper electrode 1330 of the 2-1$^{st}$ pixel P2-1 may be referred to as a second first conductive pattern (hereinafter, "1-2$^{nd}$ conductive pattern"). Thus, it may be understood that the bridge 1330BR connects the 1-1$^{st}$ conductive pattern to the 1-2$^{nd}$ conductive pattern. Because the bridge 1330BR passes the boundary between an area of the 1-2$^{nd}$ pixel P1-2 and an area of the 2-1$^{st}$ pixel P2-1, the first groove GR1 and the second groove GR2 may be spaced apart from each other for this purpose. In such an embodiment, the bridge 1330BR may pass between the first groove GR1 and the second groove GR2.

The capacitor upper electrode 1330 of the 1-2$^{nd}$ pixel P1-2, the capacitor upper electrode 1330 of the 2-1$^{st}$ pixel P2-1, and the bridge 1330BR may be integrally formed with each other as a single unitary unit as those illustrated in FIG. 7.

In an embodiment, as illustrated in FIG. 15, in a view in a direction (z-axis direction) perpendicular to the substrate 100, an end of the first groove GR1 in the direction (-y direction) of the second groove GR2 may overlap one edge of the bridge 1330BR in the direction (+y direction) of the first groove GR1. In such an embodiment, an end of the second groove GR2 in the direction (+y direction) of the first groove GR1 may overlap one edge of the bridge 1330BR in the direction (-y direction) of the second groove GR2.

For reference, FIG. 15 illustrates an embodiment where all of the buffer layer 111, the first insulating layer 113, the second insulating layer 115, the third insulating layer 117, and the fourth insulating layer 118 are considered as an insulating layer including an inorganic material and the first groove GR1 and the second groove GR2 are formed in the insulating layer including an inorganic material.

Figure 16:
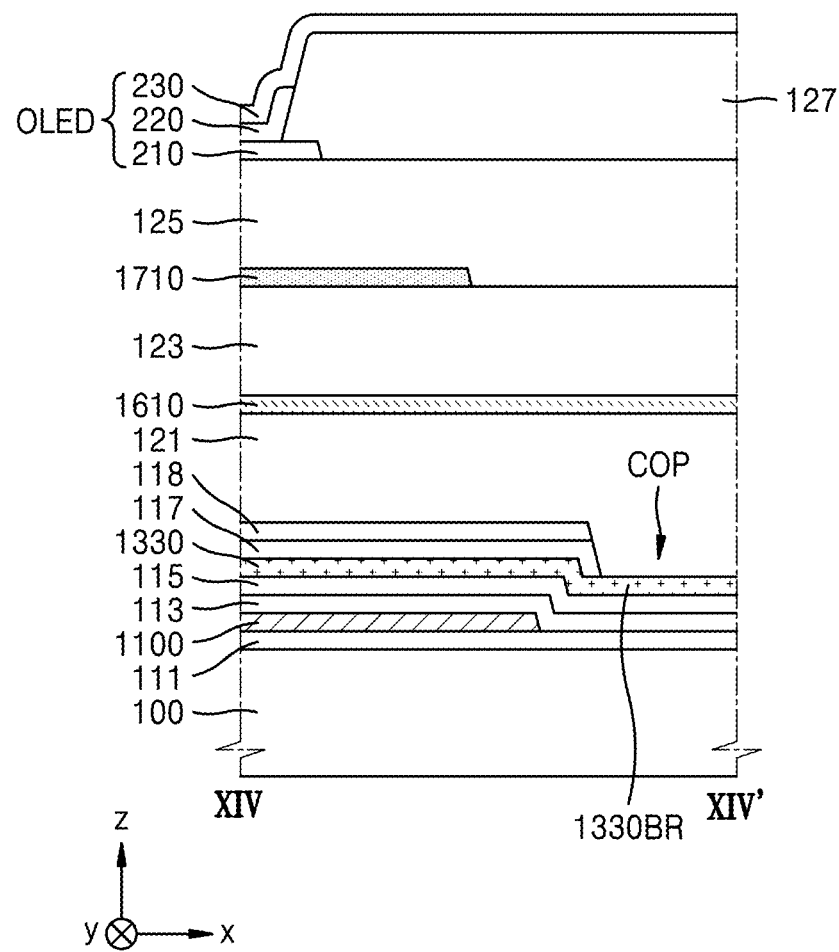
FIGS. 16 and 17 are cross-sectional views schematically illustrating a portion of a display apparatus according to another embodiment.
Figure 17:
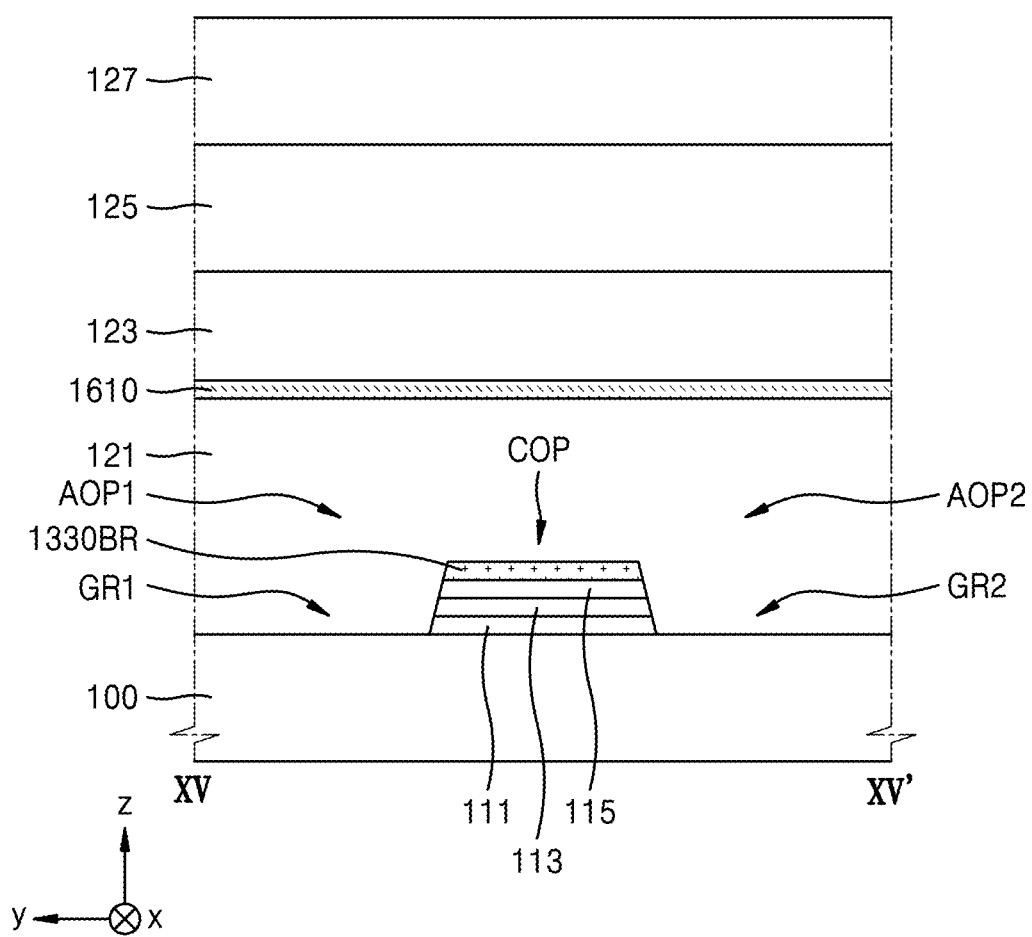

Although FIGS. 14 and 15 illustrate that the third insulating layer 117 and the fourth insulating layer 118 remain on the entire area of the upper surface of the bridge 1330BR, the disclosure is not limited thereto. In one alternative embodiment, for example, as illustrated in FIGS. 16 and 17 that are cross-sectional views schematically illustrating a portion of a display apparatus, the third insulating layer 117 and the fourth insulating layer 118, which may be referred to as a second insulating layer, may include a first additional opening AOP1 corresponding to the first groove GR1 of the buffer layer 111, the first insulating layer 113, and the second insulating layer 115, which may be referred to as a first insulating layer. In such an embodiment, the third insulating layer 117 and the fourth insulating layer 118 may include a second addition opening AOP2 corresponding to the second groove GR2 of the buffer layer 111, the first insulating layer 113, and the second insulating layer 115, and the third insulating layer 117 and the fourth insulating layer 118 may include a connection opening COP connecting the first additional opening AOP1 to the second additional opening AOP2. The first additional opening AOP1, the connection opening COP, and the second additional opening AOP2 may be continuous with each other.

Accordingly, as illustrated in FIG. 16, in a cross-section perpendicular to the y-axis, it may appear that the connection opening COP is located over or disposed on the bridge 1330BR. Also, as illustrated in FIG. 17, the first additional opening AOP1, the connection opening COP, and the second additional opening AOP2 may appear in a cross-section perpendicular to the x-axis. That is, when the buffer layer 111, the first insulating layer 113, and the second insulating layer 115 have a same shape as illustrated in FIG. 13 that is a plan view as described above, the third insulating layer 117 and the fourth insulating layer 118 may have the shape of an insulating layer including a groove in which the first groove GR1 and the second groove GR2 are connected to and integrated with each other in FIG. 13.

In an embodiment, as illustrated in FIG. 15, the first planarization layer 121 may fill the first groove GR1 and the second groove GR2. Alternatively, as illustrated in FIG. 17, the first planarization layer 121 may fill the first groove GR1, the second groove GR2, the first additional opening AOP1, the second additional opening AOP2, and the connection opening COP. The first planarization layer 121 may include an organic insulating material as described above. Thus, a crack, which may be formed in an insulating layer including an inorganic material and be grown along the insulating layer, may not grow any further when it reach the first planarization layer 121 including an organic insulating material.

In an embodiment, the first groove GR1 and the second groove GR2 are formed or defined in the insulating layer including an inorganic material, such that the first gate line 1210, the second gate line 1230, the third gate line 1310, the fourth gate line 1320, the fifth gate line 1520, and the sixth gate line 1530 may not extend beyond the first groove GR1 or the second groove GR2 as illustrated in FIGS. 6, 7, and 9. In such an embodiment, as described above, the eighth connection line 1691 to the eleventh connection line 1694 may be located over or disposed on the first planarization layer 121 that may be referred to as a third insulating layer, and the eighth connection line 1691 to the eleventh connection line 1694 may extend beyond the first groove GR1 or the second groove GR2 to electrically connect the first gate line 1210, the second gate line 1230, the third gate line 1310, the fourth gate line 1320, the fifth gate line 1520, and the sixth gate line 1530 to the corresponding ones.

In one embodiment, for example, the eighth connection line 1691 may be connected to the third gate line 1310 through the contact hole 1691CNT1. In such an embodiment, the eighth connection line 1691 may electrically connect the third gate line 1310 of the 1-$1^{st}$ pixel P1-1 to the third gate line 1310 of the pixel located in the opposite direction (-x direction) of the 1-$1^{st}$ pixel P1-1 with respect to the 1-$2^{nd}$ pixel P1-2. The ninth connection line 1692 may be connected to the fourth gate line 1320 through the contact hole 1692CNT1. Also, the ninth connection line 1692 may electrically connect the fourth gate line 1320 of the 1-$1^{st}$ pixel P1-1 to the fourth gate line 1320 of the pixel located in the opposite direction (-x direction) of the 1-$1^{st}$ pixel P1-1 with respect to the 1-$2^{nd}$ pixel P1-2.

Moreover, a third planarization layer 125 may cover the fifth conductive layer 1700 and may be located over or disposed on the second planarization layer 123. The third planarization layer 125 may include an organic insulating material. In one embodiment, for example, the third planarization layer 125 may include a photoresist, BCB, polyimide, HMDSO, PMMA, PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any mixture thereof.

An organic light emitting diode OLED may be located over or disposed on the third planarization layer 125. The organic light emitting diode OLED may include a pixel electrode 210, an intermediate layer 220 including an emission layer, and an opposite electrode 230.

The pixel electrode 210 may be a (semi)transparent electrode or a reflective electrode. In one embodiment, for example, the pixel electrode 210 may include a reflective layer including Ag, Mg, Al, Pt, Pd, Au, Ni, Nd, Ir, Cr, or any compound thereof and a transparent or semitransparent electrode layer located over or disposed on the reflective layer. The transparent or semitransparent electrode layer may include at least one selected from ITO, IZO, zinc oxide (ZnO), indium oxide ($In_2O_3$), indium gallium oxide ("IGO"), and aluminum zinc oxide ("AZO"). In one embodiment, for example, the pixel electrode 210 may have a three-layer structure of ITO/Ag/ITO.

A pixel definition layer 127 may be arranged or disposed over the third planarization layer 125. The pixel definition layer 127 may increase the distance between the edge of the pixel electrode 210 and the opposite electrode 230 over the pixel electrode 210 to prevent an arc or the like from occurring at the edge of the pixel electrode 210.

The pixel definition layer 127 may include an organic insulating material of at least one of polyimide, polyamide, acrylic resin, BCB, and phenol resin.

At least a portion of the intermediate layer 220 of the organic light emitting diode OLED may be disposed in an opening defined by or through the pixel definition layer 127. The intermediate layer 220 may include an emission layer. The emission layer may include an organic material including a fluorescent or phosphorescent material emitting red, green, blue, or white light. The emission layer may include a low molecular weight organic material or a high molecular weight organic material, and functional layers such as a hole transport layer ("HTL"), a hole injection layer ("HIL"), an electron transport layer ("ETL"), and an electron injection layer ("EIL") may optionally be further arranged under and over the emission layer.

The emission layer may have a patterned shape corresponding to each of the pixel electrodes 210. Layers other than the emission layer included in the intermediate layer 220 may be variously modified, such as being integrally formed as a single unitary unit across a plurality of pixel electrodes 210.

The opposite electrode 230 may be a transparent electrode or a reflective electrode. In one embodiment, for example, the opposite electrode 230 may be a transparent or semi-transparent electrode and may include a thin metal layer having a low work function and including Li, Ca, LiF, Al, Ag, Mg, or any compound thereof. In an embodiment, the opposite electrode 230 may further include a transparent conductive oxide ("TCO") layer such as ITO, IZO, ZnO, or $In_2O_3$ located over or disposed on the thin metal layer. The opposite electrode 230 may be integrally formed as a single unitary unit over the entire surface of the display area DA and may be arranged or disposed over the intermediate layer 220 and the pixel definition layer 127.

Figure 18:
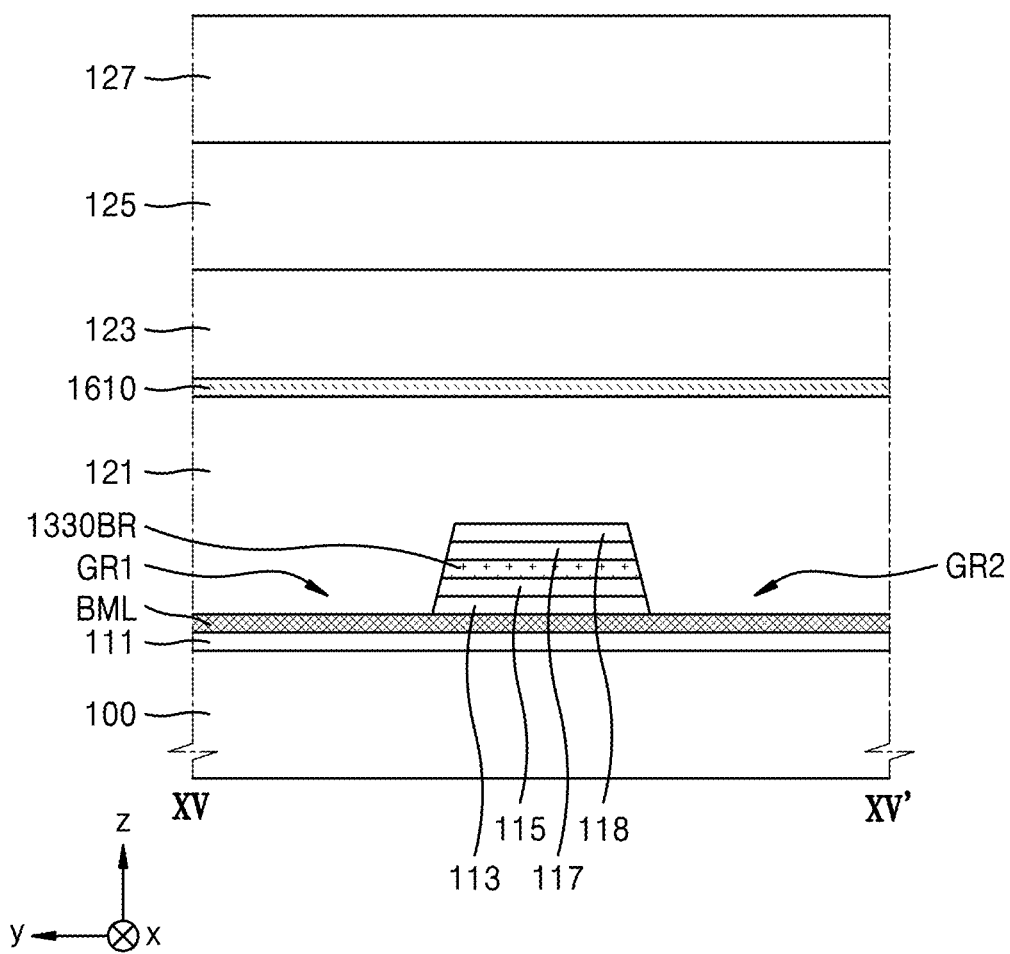
FIG. 18 is a cross-sectional view schematically illustrating a cross-section of a portion of a display apparatus according to an embodiment.

FIG. 18 is a cross-sectional view schematically illustrating a cross-section of a portion of a display apparatus according to an embodiment.

The display apparatus illustrated in FIG. 18 is substantially the same as the display apparatus described above with reference to FIG. 15, except that a buffer layer 111 is not patterned and a bottom metal layer BML is located over or disposed on the buffer layer 111. In such an embodiment, when a first groove GR1, a second groove GR2, and the like are formed, the bottom metal layer BML may prevent the substrate 100 thereunder from being damaged. In a view in a direction (z-axis direction) perpendicular to the substrate 100, the bottom metal layer BML may have a similar shape as the first groove GR1, the second groove GR2, and the like and may substantially overlap the first groove GR1, the second groove GR2, and the like.

Figure 19:
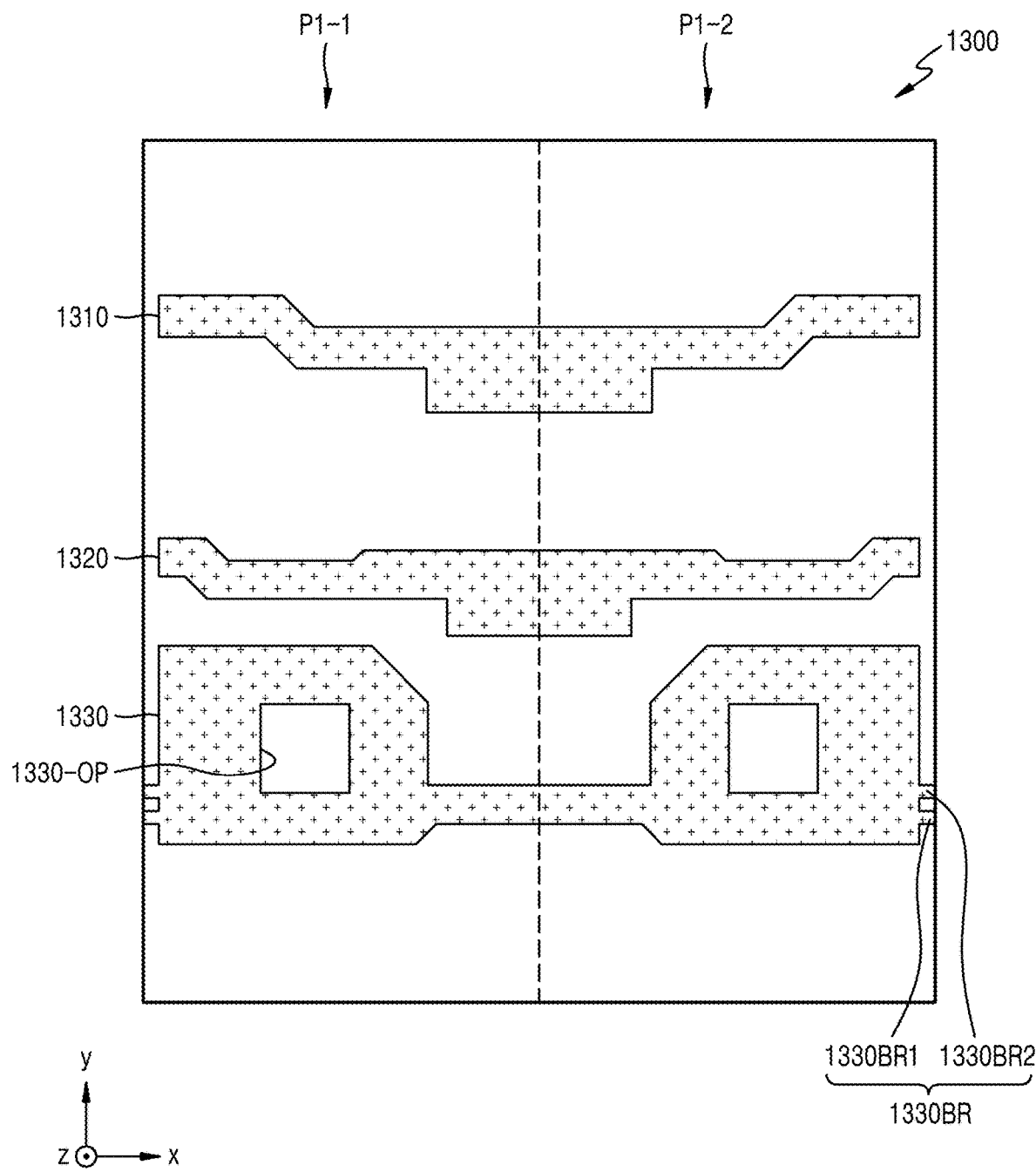
FIG. 19 is a plan view schematically illustrating a conductive layer included in a display apparatus according to an embodiment.
Figure 20:
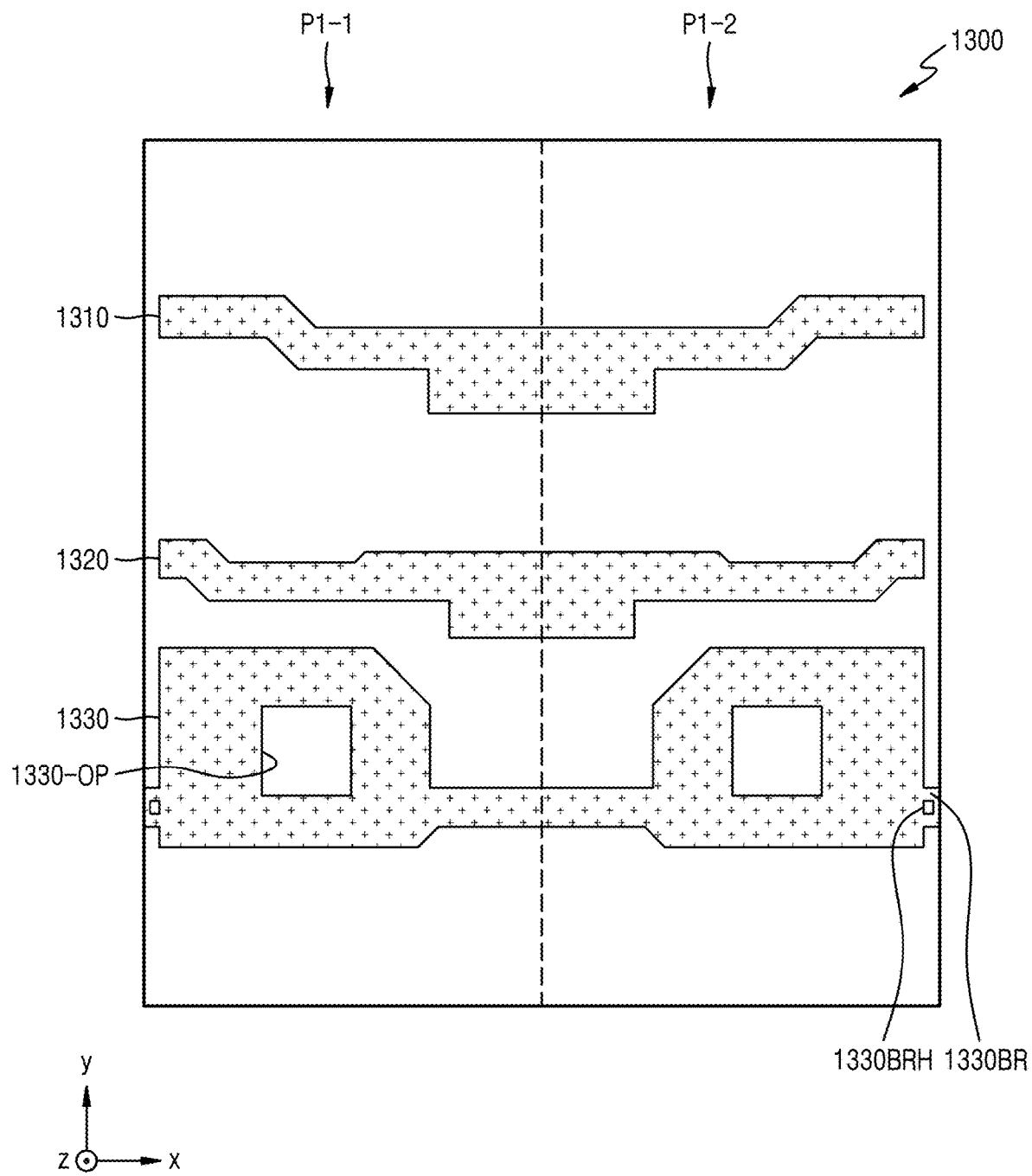
FIG. 20 is a plan view schematically illustrating a conductive layer included in a display apparatus according to an embodiment.

FIGS. 19 and 20 are plan views schematically illustrating a conductive layer included in a display apparatus according to an embodiment.

As illustrated in FIG. 19, the bridge 1330BR may include a first prong 1330BR1 connecting the capacitor upper electrode 1330 of the 1-$2^{nd}$ pixel P1-2 to the capacitor upper electrode 1330 of the 2-$1^{st}$ pixel P2-1 and a second prong 1330BR2 connecting the capacitor upper electrode 1330 of the 1-$2^{nd}$ pixel P1-2 to the capacitor upper electrode 1330 of the 2-$1^{st}$ pixel P2-1 and spaced apart from the first prong 1330BR1. Alternatively, as illustrated in FIG. 20 that is a plan view schematically illustrating a conductive layer included in a display apparatus according to an embodiment, the bridge 1330BR may include a plurality of through holes 1330BRH along the extension direction (x-axis direction) thereof. FIG. 20 illustrates that the bridge 1330BR includes two through holes 1330BRH.

In an embodiment, as illustrated in FIG. 12, a 1-$1^{st}$ semiconductor layer 1101 located in the 1-$2^{nd}$ pixel P1-2 and a 1-$2^{nd}$ semiconductor layer 1102 located in the 2-$2^{nd}$ pixel P2-2 adjacent to the 1-$2^{nd}$ pixel P1-2 (in the +y direction) may be interconnected by a bridge 1100BR. The 1-$1^{st}$ semiconductor layer 1101, the 1-$2^{nd}$ semiconductor layer 1102, and the bridge 1100BR may be integrally formed as a single unitary unit as illustrated in FIG. 12. The bridge 1100BR may be located at the boundary between an area of the 1-2$^{nd}$ pixel P1-2 and an area of the 2-2$^{nd}$ pixel P2-2 as illustrated in FIG. 13 and may pass between the first groove GR1 and the third groove GR3 spaced apart from each other.

In such an embodiment, the 1-1$^{st}$ semiconductor layer 1101 located in the 1-2$^{nd}$ pixel P1-2 and the 1-2$^{nd}$ semiconductor layer 1102 located in the 2-2$^{nd}$ pixel P2-2 may be connected to the bridge 1100BR integrally formed as a single unitary unit with the 1-1$^{st}$ semiconductor layer 1101 and the 1-2$^{nd}$ semiconductor layer 1102, instead of being connected to a conductive layer located in a different layer than the 1-1$^{st}$ semiconductor layer 1101 and the 1-2$^{nd}$ semiconductor layer 1102, to simplify a connection structure thereof to reduce the size of each pixel, thereby implementing a high-resolution display apparatus.

Figure 21:
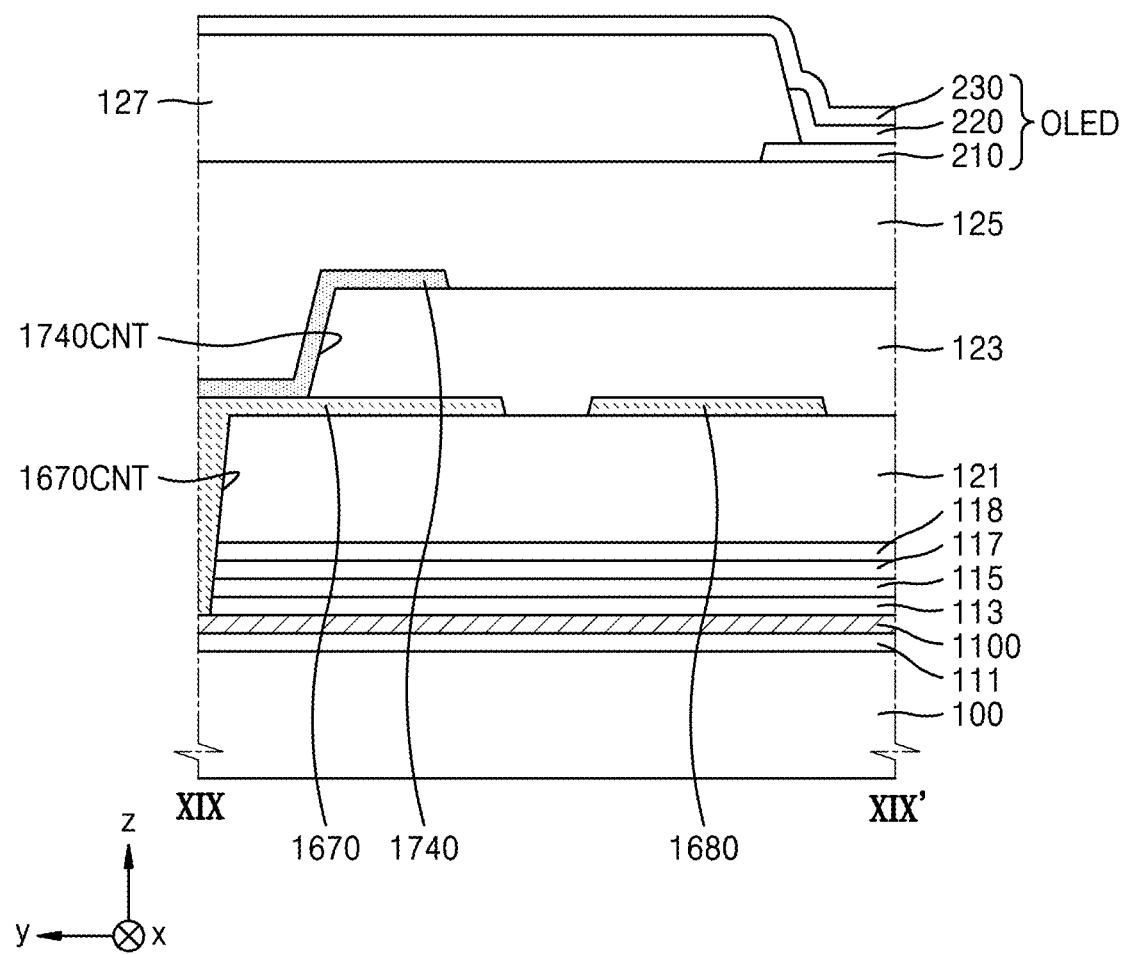
FIG. 21 is a cross-sectional view schematically illustrating a cross-section taken along line XIX-XIX' of FIG. 4.
Figure 22:
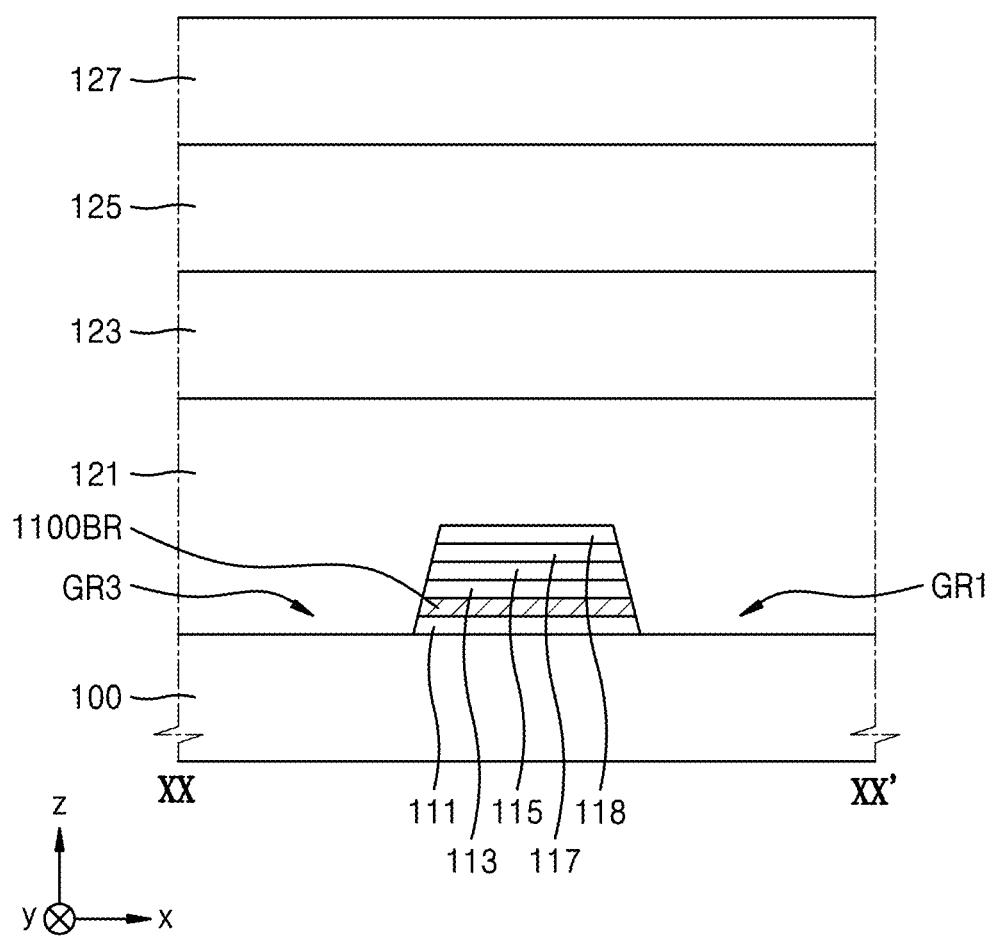
FIG. 22 is a cross-sectional view schematically illustrating a cross-section taken along line XX-XX' of FIG. 4.

FIG. 21 is a cross-sectional view schematically illustrating a cross-section taken along line XIX-XIX' of FIG. 4, and FIG. 22 is a cross-sectional view schematically illustrating a cross-section taken along line XX-XX' of FIG. 4.

In an embodiment, as illustrated in FIGS. 21 and 22, the first planarization layer 121 may fill the first groove GR1 and the third groove GR3. The first planarization layer 121 may include an organic insulating material as described above. Thus, a crack, which may occur in an insulating layer including an inorganic material and be grown along the insulating layer, may not grow any further when it reach the first planarization layer 121 including an organic insulating material.

In an embodiment, as illustrated in FIG. 22, in a view in a direction (z-axis direction) perpendicular to the substrate 100, an end of the first groove GR1 in the direction (−x direction) of the third groove GR3 may overlap one edge of the bridge 1100BR in the direction (+x direction) of the first groove GR1. In such an embodiment, an end of the third groove GR3 in the direction (+x direction) of the first groove GR1 may overlap one edge of the bridge 1100BR in the direction (−x direction) of the third groove GR3.

For reference, FIGS. 21 and 22 illustrate an embodiment where all of the buffer layer 111, the first insulating layer 113, the second insulating layer 115, the third insulating layer 117, and the fourth insulating layer 118 are considered as an insulating layer including an inorganic material and the first groove GR1 and the third groove GR3 are formed in the insulating layer including an inorganic material.

Figure 23:
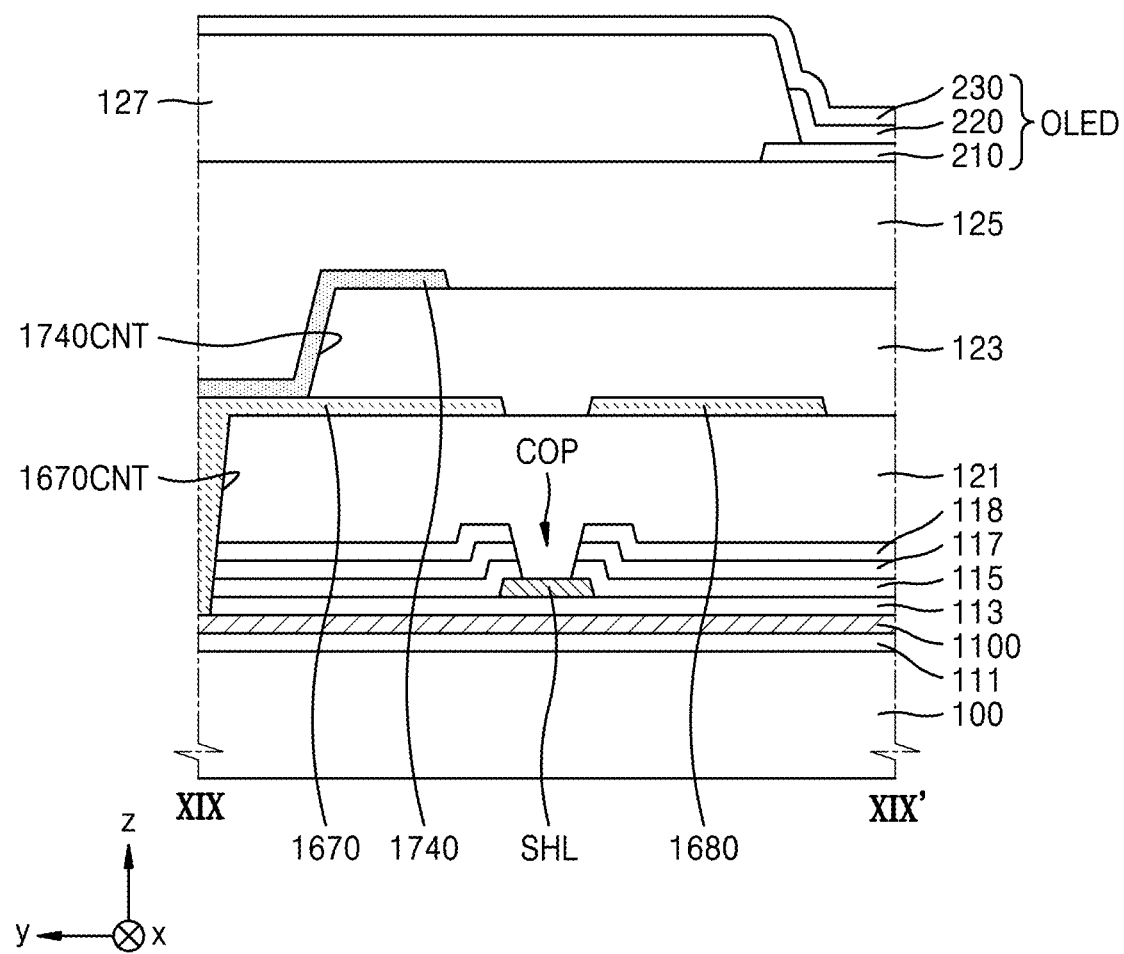
FIGS. 23 and 24 are cross-sectional views schematically illustrating a cross-section of a portion of a display apparatus according to an embodiment.
Figure 24:
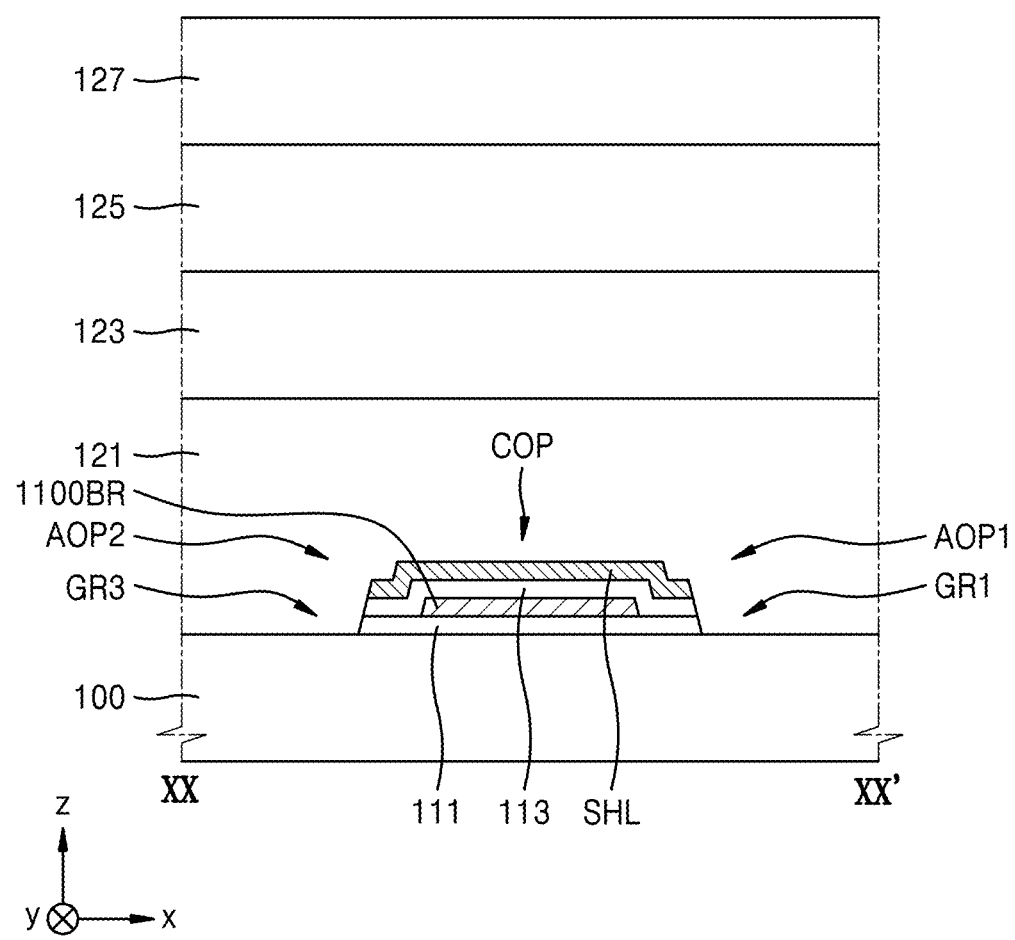

FIGS. 23 and 24 are cross-sectional views schematically illustrating a cross-section of a portion of a display apparatus according to an embodiment.

As illustrated, in an embodiment of the display apparatus, the first conductive layer 1200 may include a shield layer SHL. The shield layer SHL may overlap the bridge 1100BR in a view in a direction (z-axis direction) perpendicular to the substrate 100.

When a portion of the buffer layer 111, the first insulating layer 113, the second insulating layer 115, the third insulating layer 117, and the fourth insulating layer 118 is removed to form the first groove GR1, the third groove GR3, and the like, the shield layer SHL may protect and prevent the layers thereunder from being damaged. In an embodiment, as illustrated in FIG. 23, when a portion of the second insulating layer 115, the third insulating layer 117, and the fourth insulating layer 118 is removed over the shield layer SHL, the shield layer SHL including a metal may protect the layers thereunder.

FIG. 24 illustrates an embodiment where the width of the shield layer SHL is greater than the width of the bridge 1100BR in a direction (x-axis direction) perpendicular to an imaginary straight line (parallel to the y-axis) connecting the center of an area of the 1-2$^{nd}$ pixel P1-2 to the center of an area of the 2-2$^{nd}$ pixel P2-2. Accordingly, the bridge 1100BR under the shield layer SHL may be reliably protected.

In an embodiment of the display apparatus, the second insulating layer 115, the third insulating layer 117, and the fourth insulating layer 118, which may be referred to as a second insulating layer, may include a first additional opening AOP1 corresponding to the first groove GR1 of the first insulating layer 113 and the buffer layer 111, which may be referred to as a first insulating layer. In such an embodiment, the second insulating layer 115, the third insulating layer 117, and the fourth insulating layer 118 may include a second addition opening AOP2 corresponding to the third groove GR3 of the first insulating layer 113 and the buffer layer 111, and the second insulating layer 115, the third insulating layer 117, and the fourth insulating layer 118 may include a connection opening COP connecting the first additional opening AOP1 to the second additional opening AOP2. The first additional opening AOP1, the connection opening COP, and the second additional opening AOP2 may be continuous or connected with each other.

In an embodiment, as illustrated in FIG. 23, in a cross-section perpendicular to the x-axis, it may appear that the connection opening COP is located over or disposed on the shield layer SHL. In an embodiment, as illustrated in FIG. 24, the first additional opening AOP1, the connection opening COP, and the second additional opening AOP2 may appear in a cross-section perpendicular to the y-axis. In an embodiment, where the buffer layer 111 and the first insulating layer 113 have the same shape as illustrated in FIG. 13 that is a plan view as described above, the second insulating layer 115, the third insulating layer 117, and the fourth insulating layer 118 may have the shape of an insulating layer including a groove in which the first groove GR1 and the third groove GR3 are connected to and integrated with each other in FIG. 13.

In an embodiment, as illustrated in FIGS. 23 and 24, the first planarization layer 121 may fill the first groove GR1, the third groove GR3, the first additional opening AOP1, the second additional opening AOP2, and the connection opening COP. The first planarization layer 121 may include an organic insulating material as described above. Thus, a crack, which may occur in an insulating layer including an inorganic material and be grown along the insulating layer, may not grow any further when it reach the first planarization layer 121 including an organic insulating material.

In an embodiment, as illustrated in FIG. 24, in a view in a direction (z-axis direction) perpendicular to the substrate 100, an end of the first groove GR1 in the direction (−x direction) of the third groove GR3 may overlap one edge of the shield layer SHL in the direction (+x direction) of the first groove GR1. In such an embodiment, an end of the third groove GR3 in the direction (+x direction) of the first groove GR1 may overlap one edge of the shield layer SHL in the direction (−x direction) of the third groove GR3. In such an embodiment, the first groove GR1 and the third groove GR3 may be formed outside the shield layer SHL by using the shield layer SHL including a metal.

In an embodiment illustrated in FIG. 24, only the buffer layer 111 may be referred to as a first insulating layer, the first insulating layer 113 may be referred to as a second insulating layer, and the second insulating layer 115, the third insulating layer 117, and the fourth insulating layer 118 may be referred to as a third insulating layer. In this case, the buffer layer 111 as the first insulating layer may include a first groove GR1 and a third groove GR3, the first insulating layer 113 as the second insulating layer may include a first additional opening exposing the first groove GR1 and a second additional opening exposing the third groove GR3, and the second insulating layer 115, the third insulating layer 117, and the fourth insulating layer 118 as the third insulating layer may include a third additional opening exposing the first additional opening, a fourth additional opening exposing the second additional opening, and a connection opening connecting the third additional opening to the fourth additional opening. In this case, the third additional opening, the connection opening, and the fourth additional opening may be continuous or connected with each other.

Figure 25:
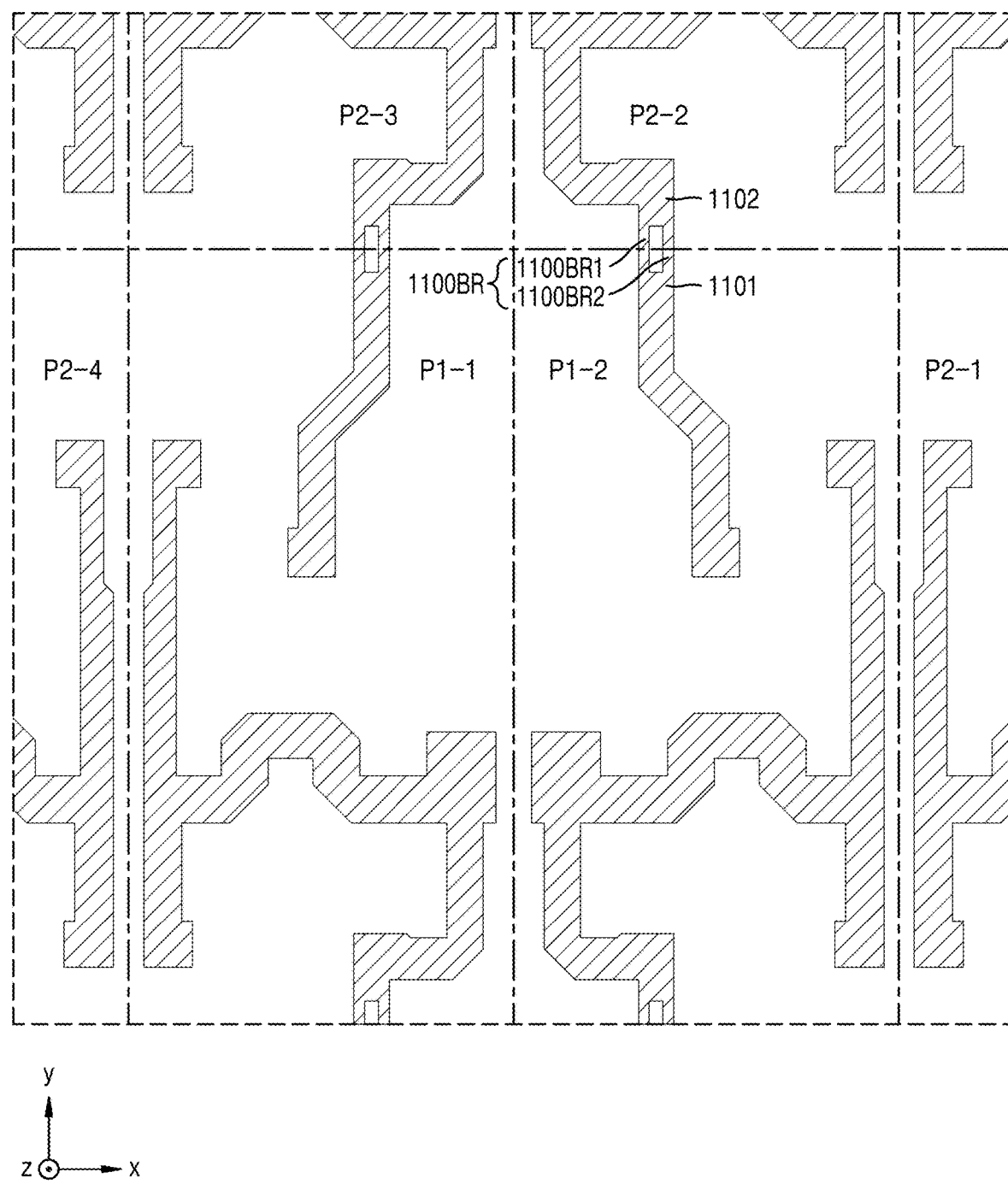
FIG. 25 is a plan view schematically illustrating, in a plurality of pixels, a first semiconductor layer included in a display apparatus according to an embodiment.
Figure 26:
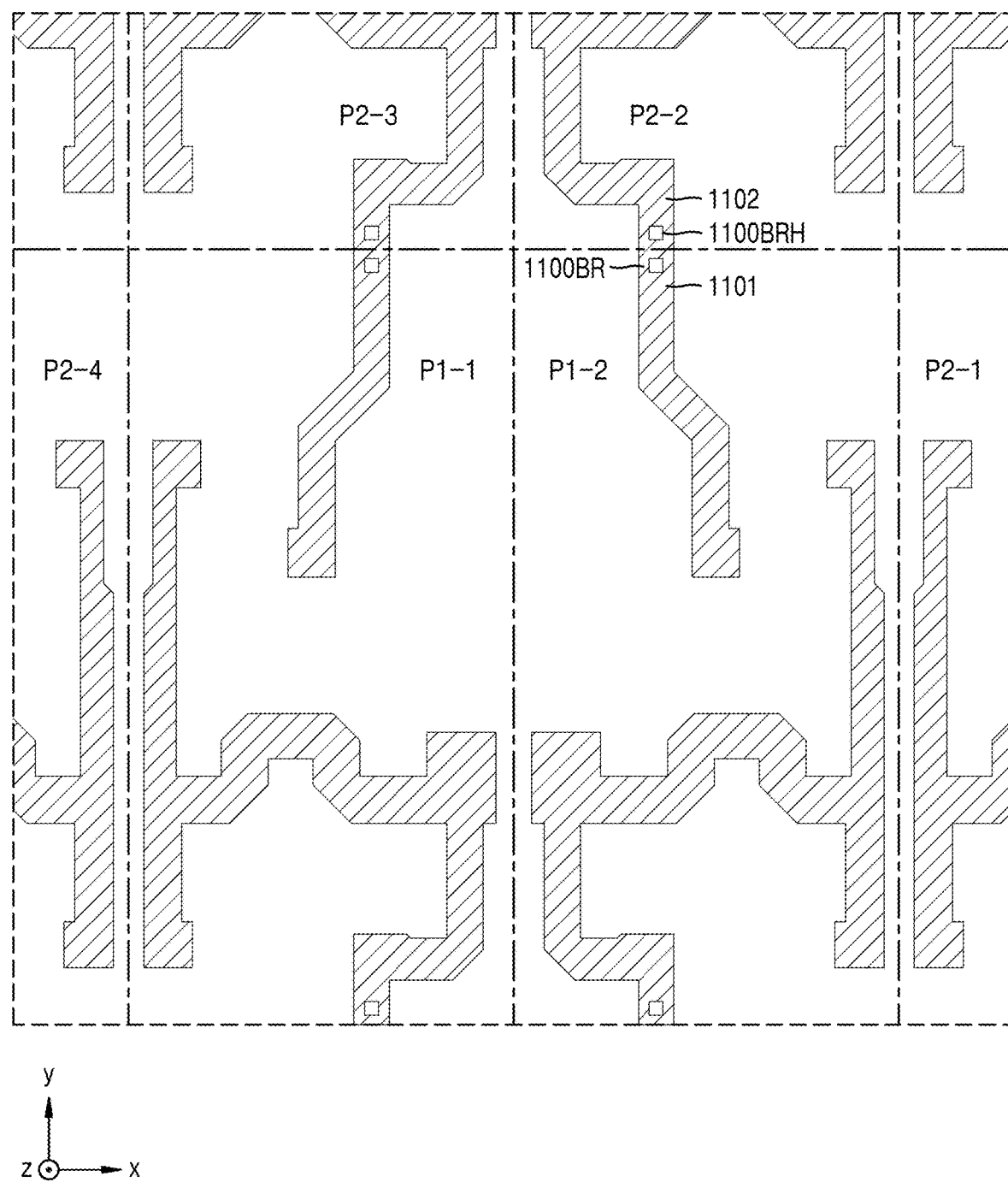
FIG. 26 is a plan view schematically illustrating, in a plurality of pixels, a first semiconductor layer included in a display apparatus according to an embodiment.

FIGS. 25 and 26 are plan views schematically illustrating, in a plurality of pixels, a first semiconductor layer included in a display apparatus according to an embodiment.

In an embodiment, as illustrated in FIG. 25, the bridge 1100BR may include a first prong 1100BR1 connecting the 1-1$^{st}$ semiconductor layer 1101 of the 1-2$^{nd}$ pixel P1-2 to the 1-2$^{nd}$ semiconductor layer 1102 of the 2-2$^{nd}$ pixel P2-2 and a second prong 1100BR2 connecting the 1-1$^{st}$ semiconductor layer 1101 of the 1-2$^{nd}$ pixel P1-2 to the 1-2$^{nd}$ semiconductor layer 1102 of the 2-2$^{nd}$ pixel P2-2. Alternatively, as illustrated in FIG. 26 that is a plan view schematically illustrating a first semiconductor layer included in a display apparatus, the bridge 1100BR may include a plurality of through holes 1100BRH along the extension direction (y-axis direction) thereof. FIG. 26 illustrates that the bridge 1100BR includes two through holes 1100BRH.

Figure 27:
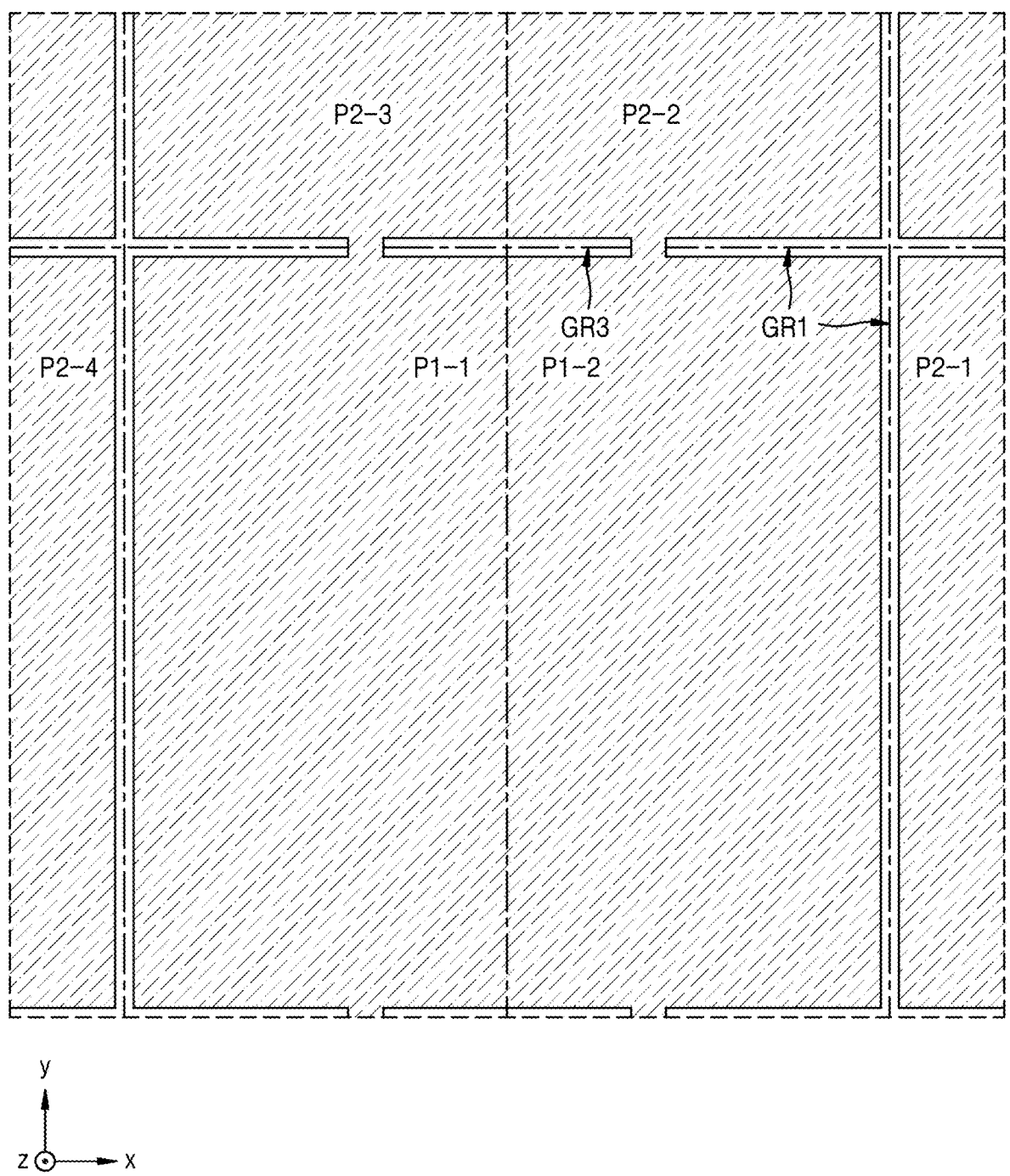
FIG. 27 is a plan view schematically illustrating, in a plurality of pixels, an insulating layer included in a display apparatus according to an embodiment.

FIG. 27 is a plan view schematically illustrating, in a plurality of pixels, an insulating layer included in a display apparatus according to an embodiment.

In an embodiment where the capacitor upper electrodes 1330 are not directly connected to each other in the 1-2$^{nd}$ pixel P1-2 and the 2-1$^{st}$ pixel P2-1 unlike the illustration in FIG. 7, the insulating layer in which the grooves are formed may have a shape as illustrated in FIG. 27. In such an embodiment, the first groove GR1 and the second groove GR2 in FIG. 13 may be connected to and integrated with each other.

Figure 28:
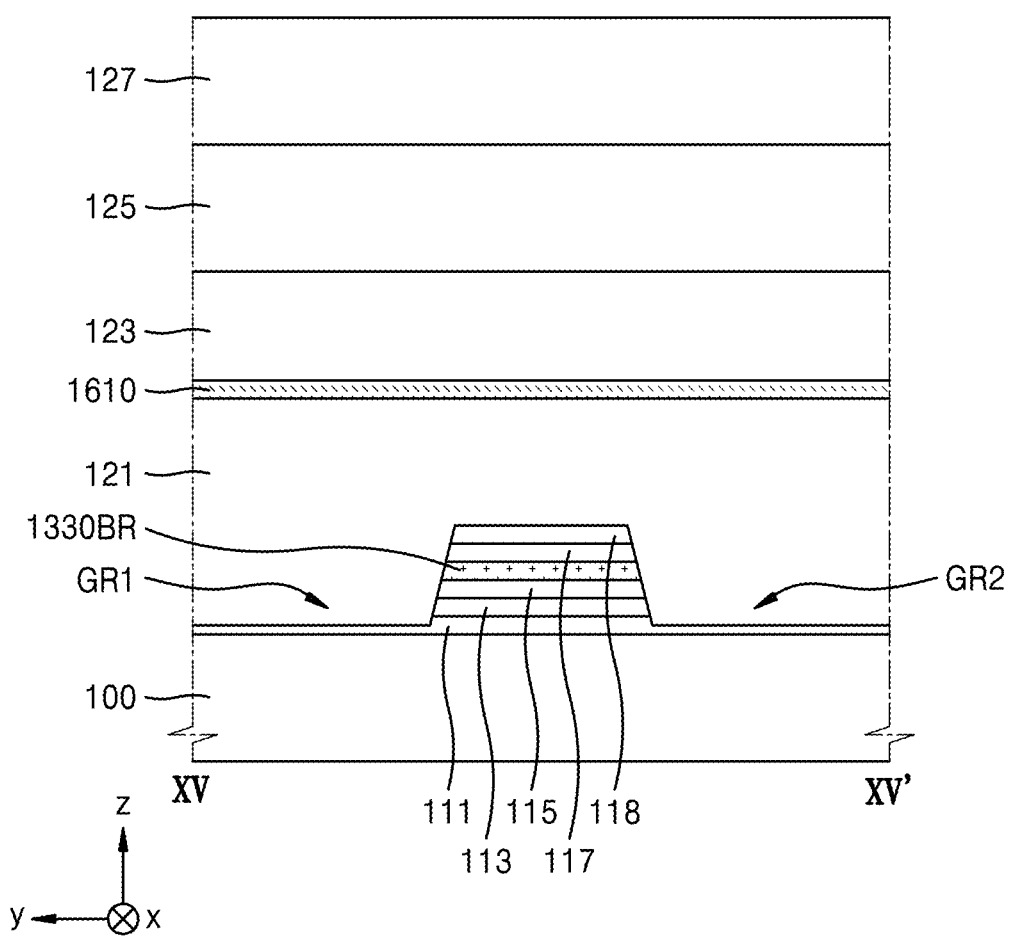
FIG. 28 is a cross-sectional view schematically illustrating a cross-section of a portion of a display apparatus according to an embodiment.

FIG. 28 is a cross-sectional view schematically illustrating a cross-section of a portion of a display apparatus according to an embodiment.

In an embodiment of the display apparatus described above with reference to FIG. 15, the buffer layer 111 may be completely removed in a portion where the first groove GR1 and the second groove GR2 are formed. However, the disclosure is not limited thereto. In one alternative embodiment, for example, as illustrated in FIG. 28, the buffer layer 111 may partially remain instead of being completely removed in a portion where the first groove GR1 and the second groove GR2 are formed. In such an embodiment, the thickness of the buffer layer 111 at a portion where the first groove GR1 and the second groove GR2 is formed may be smaller than the thickness of the buffer layer 111 under the bridge 1330BR. Such a modification may also be applied to the embodiments described above with reference to FIGS. 17, 22, and 24.

According to embodiments as described above, a display apparatus may display a high-resolution image with reduced defect rate due to an external impact.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
    a substrate including a first pixel area and a second pixel area adjacent to each other;
    a first insulating layer disposed on the substrate, wherein a first groove or a first opening corresponding to a boundary between the first pixel area and the second pixel area and a second groove or a second opening corresponding to the boundary between the first pixel area and the second pixel area are defined in the first insulating layer, and the second groove or the second opening is apart from the first groove or the first opening; and
    a first conductive layer disposed over the first insulating layer, wherein the first conductive layer includes a first conductive pattern disposed in the first pixel area, a second conductive pattern disposed in the second pixel area, and a bridge connecting the first conductive pattern to the second conductive pattern.

2. The display apparatus of claim 1, wherein the first conductive pattern, the second conductive pattern, and the bridge are integrally formed with each other as a single unitary unit.

3. The display apparatus of claim 1, wherein the bridge passes between the first groove or the first opening and the second groove or the second opening.

4. The display apparatus of claim 1, wherein
    in a view in a direction perpendicular to the substrate, an end of the first groove or the first opening in a direction therefrom to the second groove or the second opening overlaps one edge of the bridge in a direction therefrom to the first groove or the first opening, and
    an end of the second groove or the second opening in a direction therefrom to the first groove or the first opening overlaps another edge of the bridge in a direction therefrom to the second groove or the second opening.

5. The display apparatus of claim 1, wherein the bridge includes a first prong connecting the first conductive pattern to the second conductive pattern and a second prong connecting the first conductive pattern to the second conductive pattern.

6. The display apparatus of claim 1, wherein a plurality of through holes are defined through the bridge.

7. The display apparatus of claim 1, further comprising:
    a second insulating layer covering the first conductive layer,
    wherein a first additional opening exposing the first groove or the first opening, a second additional opening exposing the second groove or the second opening, and a connection opening connecting the first additional opening to the second additional opening are defined in the second insulating layer, and
    the first additional opening, the connection opening, and the second additional opening are connected with each other.

8. The display apparatus of claim 7, wherein
    the first conductive layer further includes a first line disposed in the first pixel area and a second line disposed in the second pixel area, and
    the display apparatus further comprises:
    a third insulating layer disposed over the second insulating layer and filling the first groove or the first opening, the second groove or the second opening, the first additional opening, the second additional opening, and the connection opening; and a second conductive layer disposed over the third insulating layer, wherein the second conductive layer includes a connection conductive pattern electrically connecting the first line to the second line by contacting the first line and the second line through contact holes defined in the second insulating layer and the third insulating layer.

9. A display apparatus comprising:

a substrate including a first pixel area and a second pixel area adjacent to each other;

a first insulating layer disposed over the substrate, wherein a first groove or a first opening corresponding to a boundary between the first pixel area and the second pixel area and a second groove or a second opening corresponding to the boundary between the first pixel area and the second pixel area are defined in the first insulating layer, and the second groove or a second opening is apart from the first groove or the first opening; and a first semiconductor layer disposed over the first insulating layer, wherein the first semiconductor layer includes a first semiconductor layer disposed in the first pixel area, a second semiconductor layer disposed in the second pixel area, and a bridge connecting the first semiconductor layer to the second semiconductor layer.

10. The display apparatus of claim 9, wherein the first semiconductor layer, the second semiconductor layer, and the bridge are integrally formed with each other as a single unitary unit.

11. The display apparatus of claim 9, wherein the bridge passes between the first groove or the first opening and the second groove or the second opening.

12. The display apparatus of claim 9, wherein in a view in a direction perpendicular to the substrate, an end of the first groove or the first opening in a direction therefrom to the second groove or the second opening overlaps one edge of the bridge in a direction therefrom to the first groove or the first opening, and an end of the second groove or the second opening in a direction therefrom to the first groove or the first opening overlaps another edge of the bridge in a direction therefrom to the second groove or the second opening.

13. The display apparatus of claim 9, wherein the bridge includes a first prong connecting the first semiconductor layer to the second semiconductor layer and a second prong connecting the first semiconductor layer to the second semiconductor layer.

14. The display apparatus of claim 9, wherein a plurality of through holes are defined in the bridge.

15. The display apparatus of claim 9, further comprising:

a second insulating layer covering the first semiconductor layer; and a first conductive layer disposed over the second insulating layer, wherein the first conductive layer includes a shield layer overlapping the bridge in a view in a direction perpendicular to the substrate.

16. The display apparatus of claim 15, wherein a width of the shield layer in a direction perpendicular to an imaginary straight line connecting a center of the first pixel area to a center of the second pixel area is greater than a width of the bridge in the direction perpendicular to the imaginary straight line.

17. The display apparatus of claim 15, wherein the first conductive layer further includes a driving gate electrode disposed in each of the first pixel area and the second pixel area.

18. The display apparatus of claim 15, wherein a first additional opening exposing the first groove or the first opening and a second additional opening exposing the second groove or the second opening are defined in the second insulating layer.

19. The display apparatus of claim 18, wherein in the view in the direction perpendicular to the substrate, an end of the first groove or the first opening in a direction therefrom to the second groove or the second opening overlaps one edge of the shield layer in a direction therefrom to the first groove or the first opening, and an end of the second groove or the second opening in a direction therefrom to the first groove or the first opening overlaps another edge of the shield layer in a direction therefrom to the second groove or the second opening.

20. The display apparatus of claim 18, further comprising a third insulating layer covering the first conductive layer, wherein a third additional opening exposing the first additional opening, a fourth additional opening exposing the second additional opening, and a connection opening connecting the third additional opening to the fourth additional opening are defined in the third insulating layer, and the third additional opening, the connection opening, and the fourth additional opening are connected with each other.

* * * * *